(12) United States Patent
Tsuchi

(10) Patent No.: US 12,525,162 B2
(45) Date of Patent: *Jan. 13, 2026

(54) DIGITAL-TO-ANALOG CONVERSION CIRCUIT, DATA DRIVER, AND DISPLAY DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 194 days.

This patent is subject to a terminal disclaimer.

(21) Appl. No.: 18/470,373

(22) Filed: Sep. 19, 2023

(65) Prior Publication Data

US 2024/0105090 A1 Mar. 28, 2024

(30) Foreign Application Priority Data

Sep. 27, 2022 (JP) .................................. 2022-153272

(51) Int. Cl.
*H03M 1/80* (2006.01)
*G09G 3/20* (2006.01)
*H03M 1/74* (2006.01)

(52) U.S. Cl.
CPC ............. *G09G 3/20* (2013.01); *H03M 1/745* (2013.01); *G09G 2310/027* (2013.01); *G09G 2310/0275* (2013.01); *G09G 2330/028* (2013.01)

(58) Field of Classification Search
CPC .............. G09G 3/20; G09G 2310/027; G09G 2310/0275; G09G 2330/028; H03M 1/745

(Continued)

(56) References Cited

U.S. PATENT DOCUMENTS 7,639,167 B2 * 12/2009 Tsuchi ................ H03F 3/45179
  330/261
7,969,342 B2 * 6/2011 Tsuchi ................ H03F 3/45179
  341/150

(Continued)

FOREIGN PATENT DOCUMENTS

JP 2002043944 2/2002
JP 2006174180 6/2006

OTHER PUBLICATIONS

"Office Action of Related, U.S. Appl. No. 18/415,655", issued on Aug. 28, 2025, p. 1-p. 14.

*Primary Examiner* — Jean B Jeanglaude
(74) *Attorney, Agent, or Firm* — JCIPRNET

(57) ABSTRACT

A digital-to-analog conversion circuit includes a differential amplifier outputting $2^N$ voltage levels dividing first and second voltages and a decoder distributing and supplying one of first and second voltages to a plurality of input terminals of the differential amplifier on the basis of digital data of N bits, and the differential amplifier includes $2^K$ differential pairs including an inverting input terminal to which an output voltage is commonly input and a non-inverting input terminal to which one of voltages received by the plurality of input terminals is input and having output pairs commonly connected with each other and a tail current control circuit individually controlling current ratios of tail currents supplied to the differential pairs on the basis of a predetermined bit of digital data, in which N is equal to or greater than 3, and K is a positive number less than N.

17 Claims, 23 Drawing Sheets

(58) Field of Classification Search
USPC .......................................................... 341/153
See application file for complete search history.

(56) References Cited

U.S. PATENT DOCUMENTS

| | | | | |
|---|---|---|---|---|
| 2006/0132344 A1* | 6/2006 | Ishii | ................ | H03M 1/76 |
| | | | | 341/144 |
| 2008/0165168 A1* | 7/2008 | Tsuchi | ................ | H03F 3/45179 |
| | | | | 330/261 |
| 2010/0052966 A1* | 3/2010 | Tsuchi | ................ | H03F 3/45179 |
| | | | | 341/154 |

\* cited by examiner

| DT BIT NUMBER | DIFFERENTIAL PAIR NUMBER | TAIL CURRENT RATIO LEVEL NUMBER | OUTPUT LEVEL NUMBER |
|---|---|---|---|
| 3 | 4 OR LESS | 3 OR MORE | 8 |
| 4 | 8 OR LESS | | 16 |
| ... | ... | | ... |
| N | $2^K$ (K<N) K IS POSITIVE NUMBER EQUAL TO OR GREATER THAN 1 | | $2^N$ |

FIG. 2

| DT BIT NUMBER | DIFFERENTIAL PAIR NUMBER | TAIL CURRENT RATIO LEVEL NUMBER | OUTPUT LEVEL NUMBER |
|---|---|---|---|
| 3 | 4 | 3 | 8 |
| 4 | 8 | | 16 |
| ⋮ | ⋮ | | ⋮ |
| N | $2^K$ (K=N−1) | | $2^N$ |

$$Vout = (m\langle 1\rangle \cdot V\langle 1\rangle + m\langle 2\rangle \cdot V\langle 2\rangle + \cdots + m\langle 2^K\rangle \cdot V\langle 2^K\rangle) / (m\langle 1\rangle + m\langle 2\rangle + \cdots + m\langle 2^K\rangle)$$

FIG. 4A

| DT BIT NUMBER | DIFFERENTIAL PAIR NUMBER | TAIL CURRENT RATIO LEVEL NUMBER | OUTPUT LEVEL NUMBER |
|---|---|---|---|
| 3 | 2 | 7 | 8 |
| 4 | 4 | | 16 |
| ⋮ | ⋮ | | ⋮ |
| N | $2^K$ (K=N−2) | | $2^N$ |

$$Vout = (m\langle 1\rangle \cdot V\langle 1\rangle + m\langle 2\rangle \cdot V\langle 2\rangle + \cdots + m\langle 2^K\rangle \cdot V\langle 2^K\rangle) / (m\langle 1\rangle + m\langle 2\rangle + \cdots + m\langle 2^K\rangle)$$

FIG. 4B

| DT BIT NUMBER | DIFFERENTIAL PAIR NUMBER | TAIL CURRENT RATIO LEVEL NUMBER | OUTPUT LEVEL NUMBER |
|---|---|---|---|
| 4 | 4 | 4 | 16 |
| 5 | 8 | | 32 |
| ⋮ | ⋮ | | ⋮ |
| N | $2^K$ (K=N-2) | | $2^N$ |

$$Vout = (m\langle 1\rangle \cdot V\langle 1\rangle + m\langle 2\rangle \cdot V\langle 2\rangle + \cdots + m\langle 2^K\rangle \cdot V\langle 2^K\rangle) / (m\langle 1\rangle + m\langle 2\rangle + \cdots + m\langle 2^K\rangle)$$

FIG. 4C

| DIGITAL DATA DT | | | | | | | | | |
|---|---|---|---|---|---|---|---|---|---|
| D2 | | 0 | 0 | 0 | 0 | 1 | 1 | 1 | 1 |
| D1 | | 0 | 0 | 1 | 1 | 0 | 0 | 1 | 1 |
| D0 | | 0 | 1 | 0 | 1 | 0 | 1 | 0 | 1 |
| NON-INVERTING INPUT TERMINAL INPUT VOLTAGE | | | | | | | | | |
| V<1> | 0 | 8 | 8 | 8 | 8 | 8 | 8 | 8 | 8 |
| V<2> | 0 | 0 | 0 | 0 | 8 | 8 | 8 | 8 | 8 |
| V<3> | 0 | 0 | 0 | 0 | 0 | 8 | 8 | 8 | 8 |
| V<4> | 0 | 0 | 0 | 0 | 0 | 0 | 0 | 0 | 8 |
| TAIL CURRENT RATIO | | | | | | | | | |
| m<1> | 1 | 0.5 | 1 | 1.5 | 1 | 0.5 | 1 | 1.5 | 1 |
| m<2> | 1 | 1 | 1 | 1 | 1 | 1 | 1 | 1 | 1 |
| m<3> | 1 | 1 | 1 | 1 | 1 | 1 | 1 | 1 | 1 |
| m<4> | 1 | 1.5 | 1 | 0.5 | 1 | 1.5 | 1 | 0.5 | 1 |
| OUTPUT VOLTAGE LEVEL | | | | | | | | | |
| Vout | 0 | 1 | 2 | 3 | 4 | 5 | 6 | 7 | 8 |

FIG. 5A

| DIGITAL DATA DT | | | | | | | | | |
|---|---|---|---|---|---|---|---|---|---|
| D2 | 0 | 0 | 0 | 0 | 1 | 1 | 1 | 1 | |
| D1 | 0 | 0 | 1 | 1 | 0 | 0 | 1 | 1 | |
| D0 | 0 | 1 | 0 | 1 | 0 | 1 | 0 | 1 | |
| NON-INVERTING INPUT TERMINAL INPUT VOLTAGE | | | | | | | | | |
| V<1> | 0 | 8 | 8 | 8 | 8 | 8 | 8 | 8 | 8 |
| V<2> | 0 | 0 | 0 | 0 | 8 | 8 | 8 | 8 | 8 |
| V<3> | 0 | 0 | 0 | 0 | 0 | 8 | 8 | 8 | 8 |
| V<4> | 0 | 0 | 0 | 0 | 0 | 0 | 0 | 0 | 8 |
| TAIL CURRENT RATIO | | | | | | | | | |
| m<1> | 1 | 0.5 | 1 | 1.5 | 1 | 0.5 | 1 | 1.5 | 1 |
| m<2> | 1 | 1 | 1 | 1 | 1 | 1 | 1 | 1 | 1 |
| m<3> | 1 | 1 | 1 | 1 | 1 | 1 | 1 | 1 | 1 |
| m<4> | 1 | 1.5 | 1 | 0.5 | 1 | 1.5 | 1 | 0.5 | 1 |
| OUTPUT VOLTAGE LEVEL | | | | | | | | | |
| Vout | 0 | 1 | 2 | 3 | 4 | 5 | 6 | 7 | 8 |

FIG. 5B

| DIGITAL DATA DT | | | | | | | | |
|---|---|---|---|---|---|---|---|---|
| D2 | 0 | 0 | 0 | 0 | 1 | 1 | 1 | 1 |
| D1 | 0 | 0 | 1 | 1 | 0 | 0 | 1 | 1 |
| D0 | 0 | 1 | 0 | 1 | 0 | 1 | 0 | 1 |
| NON-INVERTING INPUT TERMINAL INPUT VOLTAGE | | | | | | | | |
| V<1> | 0 | 8 | 8 | 8 | 8 | 8 | 8 | 8 |
| V<2> | 0 | 0 | 0 | 0 | 0 | 8 | 8 | 8 |
| V<3> | 0 | 0 | 0 | 0 | 0 | 8 | 8 | 8 |
| V<4> | 0 | 0 | 0 | 0 | 8 | 0 | 0 | 0 | 8 |
| TAIL CURRENT RATIO | | | | | | | | |
| m<1> | 1 | 0.5 | 1 | 1.5 | 1 | 0.5 | 1 | 1.5 | 1 |
| m<2> | 1 | 1 | 1 | 1 | 1 | 1 | 1 | 1 | 1 |
| m<3> | 1 | 1.5 | 1 | 0.5 | 1 | 1 | 1 | 1 | 1 |
| m<4> | 1 | 1 | 1 | 1 | 1 | 1.5 | 1 | 0.5 | 1 |
| OUTPUT VOLTAGE LEVEL | | | | | | | | |
| Vout | 0 | 1 | 2 | 3 | 4 | 5 | 6 | 7 | 8 |

FIG. 5C

| DIGITAL DATA DT | | | | | | | | | |
|---|---|---|---|---|---|---|---|---|---|
| D2 | | 0 | 0 | 0 | 0 | 1 | 1 | 1 | 1 |
| D1 | | 0 | 0 | 1 | 1 | 0 | 0 | 1 | 1 |
| D0 | | 0 | 1 | 0 | 1 | 0 | 1 | 0 | 1 |
| NON-INVERTING INPUT TERMINAL INPUT VOLTAGE | | | | | | | | | |
| V<1> | 0 | 8 | 8 | 8 | 8 | 8 | 8 | 8 | 8 |
| V<2> | 0 | 0 | 0 | 0 | 8 | 8 | 8 | 8 | 8 |
| V<3> | 0 | 0 | 0 | 0 | 0 | 8 | 8 | 8 | 8 |
| V<4> | 0 | 0 | 0 | 0 | 0 | 0 | 0 | 0 | 8 |
| TAIL CURRENT RATIO | | | | | | | | | |
| m<1> | 1 | 0.5 | 1 | 1.5 | 1 | 0.5 | 1 | 1.5 | 1 |
| m<2> | 1 | 0.5 | 1 | 1.5 | 1 | 0.5 | 1 | 1.5 | 1 |
| m<3> | 1 | 1.5 | 1 | 0.5 | 1 | 1.5 | 1 | 0.5 | 1 |
| m<4> | 1 | 1.5 | 1 | 0.5 | 1 | 1.5 | 1 | 0.5 | 1 |
| OUTPUT VOLTAGE LEVEL | | | | | | | | | |
| Vout | 0 | 1 | 2 | 3 | 4 | 5 | 6 | 7 | 8 |

FIG. 5D

| DIGITAL DATA DT | | | | | | | | | | | | | | | | | |
|---|---|---|---|---|---|---|---|---|---|---|---|---|---|---|---|---|---|
| D3 | | 0 | 0 | 0 | 0 | 0 | 0 | 0 | 0 | 1 | 1 | 1 | 1 | 1 | 1 | 1 | 1 |
| D2 | | 0 | 0 | 0 | 0 | 1 | 1 | 1 | 1 | 0 | 0 | 0 | 0 | 1 | 1 | 1 | 1 |
| D1 | | 0 | 0 | 1 | 1 | 0 | 0 | 1 | 1 | 0 | 0 | 1 | 1 | 0 | 0 | 1 | 1 |
| D0 | | 0 | 1 | 0 | 1 | 0 | 1 | 0 | 1 | 0 | 1 | 0 | 1 | 0 | 1 | 0 | 1 |
| NON-INVERTING INPUT TERMINAL INPUT VOLTAGE | | | | | | | | | | | | | | | | | |
| V<1> | 0 | 16 | 16 | 16 | 16 | 16 | 16 | 16 | 16 | 16 | 16 | 16 | 16 | 16 | 16 | 16 | 16 |
| V<2> | 0 | 0 | 0 | 0 | 16 | 16 | 16 | 16 | 16 | 16 | 16 | 16 | 16 | 16 | 16 | 16 | 16 |
| V<3> | 0 | 0 | 0 | 0 | 0 | 16 | 16 | 16 | 16 | 16 | 16 | 16 | 16 | 16 | 16 | 16 | 16 |
| V<4> | 0 | 0 | 0 | 0 | 0 | 0 | 0 | 0 | 16 | 16 | 16 | 16 | 16 | 16 | 16 | 16 | 16 |
| V<5> | 0 | 0 | 0 | 0 | 0 | 0 | 0 | 0 | 0 | 16 | 16 | 16 | 16 | 16 | 16 | 16 | 16 |
| V<6> | 0 | 0 | 0 | 0 | 0 | 0 | 0 | 0 | 0 | 0 | 0 | 0 | 16 | 16 | 16 | 16 | 16 |
| V<7> | 0 | 0 | 0 | 0 | 0 | 0 | 0 | 0 | 0 | 0 | 0 | 0 | 0 | 16 | 16 | 16 | 16 |
| V<8> | 0 | 0 | 0 | 0 | 0 | 0 | 0 | 0 | 0 | 0 | 0 | 0 | 0 | 0 | 0 | 0 | 16 |
| TAIL CURRENT RATIO | | | | | | | | | | | | | | | | | |
| m<1> | 1 | 0.5 | 1 | 1.5 | 1 | 0.5 | 1 | 1.5 | 1 | 0.5 | 1 | 1.5 | 1 | 0.5 | 1 | 1.5 | 1 |
| m<2> | 1 | 1 | 1 | 1 | 1 | 1 | 1 | 1 | 1 | 1 | 1 | 1 | 1 | 1 | 1 | 1 | 1 |
| m<3> | 1 | 1 | 1 | 1 | 1 | 1 | 1 | 1 | 1 | 1 | 1 | 1 | 1 | 1 | 1 | 1 | 1 |
| m<4> | 1 | 1 | 1 | 1 | 1 | 1 | 1 | 1 | 1 | 1 | 1 | 1 | 1 | 1 | 1 | 1 | 1 |
| m<5> | 1 | 1 | 1 | 1 | 1 | 1 | 1 | 1 | 1 | 1 | 1 | 1 | 1 | 1 | 1 | 1 | 1 |
| m<6> | 1 | 1 | 1 | 1 | 1 | 1 | 1 | 1 | 1 | 1 | 1 | 1 | 1 | 1 | 1 | 1 | 1 |
| m<7> | 1 | 1 | 1 | 1 | 1 | 1 | 1 | 1 | 1 | 1 | 1 | 1 | 1 | 1 | 1 | 1 | 1 |
| m<8> | 1 | 1.5 | 1 | 0.5 | 1 | 1.5 | 1 | 0.5 | 1 | 1.5 | 1 | 0.5 | 1 | 1.5 | 1 | 0.5 | 1 |
| OUTPUT VOLTAGE LEVEL | | | | | | | | | | | | | | | | | |
| Vout | 0 | 1 | 2 | 3 | 4 | 5 | 6 | 7 | 8 | 9 | 10 | 11 | 12 | 13 | 14 | 15 | 16 |

FIG. 7A

| DIGITAL DATA DT | | | | | | | | | | | | | | | | |
|---|---|---|---|---|---|---|---|---|---|---|---|---|---|---|---|---|
| D3 | 0 | 0 | 0 | 0 | 0 | 0 | 0 | 0 | 1 | 1 | 1 | 1 | 1 | 1 | 1 | 1 |
| D2 | 0 | 0 | 0 | 0 | 1 | 1 | 1 | 1 | 0 | 0 | 0 | 0 | 1 | 1 | 1 | 1 |
| D1 | 0 | 0 | 1 | 1 | 0 | 0 | 1 | 1 | 0 | 0 | 1 | 1 | 0 | 0 | 1 | 1 |
| D0 | 0 | 1 | 0 | 1 | 0 | 1 | 0 | 1 | 0 | 1 | 0 | 1 | 0 | 1 | 0 | 1 |
| NON-INVERTING INPUT TERMINAL INPUT VOLTAGE | | | | | | | | | | | | | | | | |
| V<1> | 16 | 16 | 16 | 16 | 16 | 16 | 16 | 16 | 16 | 16 | 16 | 16 | 16 | 16 | 16 | 16 |
| V<2> | 0 | 0 | 0 | 16 | 0 | 0 | 0 | 16 | 0 | 0 | 0 | 16 | 0 | 0 | 0 | 16 |
| V<3> | 0 | 0 | 0 | 0 | 16 | 16 | 16 | 16 | 16 | 16 | 16 | 16 | 16 | 16 | 16 | 16 |
| V<4> | 0 | 0 | 0 | 0 | 16 | 16 | 16 | 16 | 16 | 16 | 16 | 16 | 16 | 16 | 16 | 16 |
| V<5> | 0 | 0 | 0 | 0 | 0 | 0 | 0 | 0 | 16 | 16 | 16 | 16 | 16 | 16 | 16 | 16 |
| V<6> | 0 | 0 | 0 | 0 | 0 | 0 | 0 | 0 | 16 | 16 | 16 | 16 | 16 | 16 | 16 | 16 |
| V<7> | 0 | 0 | 0 | 0 | 0 | 0 | 0 | 0 | 0 | 0 | 0 | 0 | 16 | 16 | 16 | 16 |
| V<8> | 0 | 0 | 0 | 0 | 0 | 0 | 0 | 0 | 0 | 0 | 0 | 0 | 16 | 16 | 16 | 16 |
| TAIL CURRENT RATIO | | | | | | | | | | | | | | | | |
| m<1> | 1 | 0.5 | 1 | 1.5 | 1 | 0.5 | 1 | 1.5 | 1 | 0.5 | 1 | 1.5 | 1 | 0.5 | 1 | 1.5 | 1 |
| m<2> | 1 | 1 | 1 | 1 | 1 | 1 | 1 | 1 | 1 | 1 | 1 | 1 | 1 | 1.5 | 1 | 0.5 | 1 |
| m<3> | 1 | 1 | 1 | 1 | 1 | 1 | 1 | 1 | 1 | 1 | 1 | 1 | 1 | 1 | 1 | 1 |
| m<4> | 1 | 1 | 1 | 1 | 1 | 1 | 1 | 1 | 1 | 1 | 1 | 1 | 1 | 1 | 1 | 1 |
| m<5> | 1 | 1 | 1 | 1 | 1 | 1 | 1 | 1 | 1 | 1 | 1 | 1 | 1 | 1 | 1 | 1 |
| m<6> | 1 | 1 | 1 | 1 | 1 | 1 | 1 | 1 | 1 | 1 | 1 | 1 | 1 | 1 | 1 | 1 |
| m<7> | 1 | 1 | 1 | 1 | 1 | 1 | 1 | 1 | 1 | 1 | 1 | 1 | 1 | 1 | 1 | 1 |
| m<8> | 1 | 1.5 | 1 | 0.5 | 1 | 1.5 | 1 | 0.5 | 1 | 1.5 | 1 | 0.5 | 1 | 1 | 1 | 1 |
| OUTPUT VOLTAGE LEVEL | | | | | | | | | | | | | | | | |
| Vout | 0 | 1 | 2 | 3 | 4 | 5 | 6 | 7 | 8 | 9 | 10 | 11 | 12 | 13 | 14 | 15 | 16 |

FIG. 7B

| DIGITAL DATA DT |||||||||
|---|---|---|---|---|---|---|---|---|
| D2 |  | 0 | 0 | 0 | 0 | 1 | 1 | 1 | 1 |
| D1 |  | 0 | 0 | 1 | 1 | 0 | 0 | 1 | 1 |
| D0 |  | 0 | 1 | 0 | 1 | 0 | 1 | 0 | 1 |
| NON-INVERTING INPUT TERMINAL INPUT VOLTAGE |||||||||
| V<1> | 0 | 8 | 8 | 8 | 8 | 8 | 8 | 8 | 8 |
| V<2> | 0 | 0 | 0 | 0 | 0 | 0 | 0 | 0 | 8 |
| TAIL CURRENT RATIO |||||||||
| m<1> | 1 | 0.25 | 0.5 | 0.75 | 1 | 1.25 | 1.5 | 1.75 | 1 |
| m<2> | 1 | 1.75 | 1.5 | 1.25 | 1 | 0.75 | 0.5 | 0.25 | 1 |
| OUTPUT VOLTAGE LEVEL |||||||||
| Vout | 0 | 1 | 2 | 3 | 4 | 5 | 6 | 7 | 8 |

FIG. 8

| | Vout=0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| DIGITAL DATA DT | | | | | | | | | | | | | | | | | |
| D3 | 0 | 0 | 0 | 0 | 0 | 0 | 0 | 0 | 0 | 1 | 1 | 1 | 1 | 1 | 1 | 1 | 1 |
| D2 | 0 | 0 | 0 | 0 | 1 | 1 | 1 | 1 | 1 | 0 | 0 | 0 | 0 | 1 | 1 | 1 | 1 |
| D1 | 0 | 0 | 1 | 1 | 0 | 0 | 1 | 1 | 1 | 0 | 0 | 1 | 1 | 0 | 0 | 1 | 1 |
| D0 | 0 | 1 | 0 | 1 | 0 | 1 | 0 | 1 | 1 | 0 | 1 | 0 | 1 | 0 | 1 | 0 | 1 |
| NON-INVERTING INPUT TERMINAL INPUT VOLTAGE | | | | | | | | | | | | | | | | | |
| V<1> | 16 | 16 | 16 | 16 | 16 | 16 | 16 | 16 | 16 | 16 | 16 | 16 | 16 | 16 | 16 | 16 | 16 |
| V<2> | 0 | 0 | 0 | 0 | 0 | 0 | 0 | 0 | 16 | 16 | 16 | 16 | 16 | 16 | 16 | 16 | 16 |
| V<3> | 0 | 0 | 0 | 0 | 0 | 0 | 16 | 16 | 0 | 0 | 16 | 16 | 16 | 16 | 16 | 16 | 16 |
| V<4> | 0 | 0 | 0 | 16 | 0 | 16 | 0 | 16 | 0 | 0 | 0 | 0 | 16 | 0 | 16 | 0 | 16 |
| TAIL CURRENT RATIO | | | | | | | | | | | | | | | | | |
| m<1> | 1 | 0.25 | 0.5 | 0.75 | 1 | 1.25 | 1.5 | 1.75 | 1 | 1 | 0.25 | 0.5 | 0.75 | 1 | 1.25 | 1.5 | 1.75 |
| m<2> | 1 | 1 | 1 | 1 | 1 | 1 | 1 | 1 | 1 | 1 | 1 | 1 | 1 | 1 | 1 | 1 | 1 |
| m<3> | 1 | 1 | 1 | 1 | 1 | 1 | 1 | 1 | 1 | 1 | 1 | 1 | 1 | 1 | 1 | 1 | 1 |
| m<4> | 1 | 1.75 | 1.5 | 1.25 | 1 | 0.75 | 0.5 | 0.25 | 1 | 1 | 1.75 | 1.5 | 1.25 | 1 | 0.75 | 0.5 | 0.25 |
| OUTPUT VOLTAGE LEVEL | | | | | | | | | | | | | | | | | |
| Vout | 0 | 1 | 2 | 3 | 4 | 5 | 6 | 7 | 8 | 9 | 10 | 11 | 12 | 13 | 14 | 15 | 16 |

FIG. 10A

| | | | | | | | | | DIGITAL DATA DT | | | | | | | | |
|---|---|---|---|---|---|---|---|---|---|---|---|---|---|---|---|---|---|
| D3 | 0 | 0 | 0 | 0 | 0 | 0 | 0 | 0 | 1 | 1 | 1 | 1 | 1 | 1 | 1 | 1 | 1 |
| D2 | 0 | 0 | 0 | 0 | 1 | 1 | 1 | 1 | 0 | 0 | 0 | 0 | 1 | 1 | 1 | 1 | 1 |
| D1 | 0 | 0 | 1 | 1 | 0 | 0 | 1 | 1 | 0 | 0 | 1 | 1 | 0 | 0 | 1 | 1 | 1 |
| D0 | 0 | 1 | 0 | 1 | 0 | 1 | 0 | 1 | 0 | 1 | 0 | 1 | 0 | 1 | 0 | 1 | 1 |
| | | | | | | NON-INVERTING INPUT TERMINAL INPUT VOLTAGE | | | | | | | | | | | |
| V<1> | 0 | 16 | 16 | 16 | 16 | 16 | 16 | 16 | 16 | 16 | 16 | 16 | 16 | 16 | 16 | 16 | 16 |
| V<2> | 0 | 0 | 0 | 16 | 16 | 16 | 16 | 0 | 0 | 16 | 16 | 16 | 16 | 16 | 16 | 16 | 16 |
| V<3> | 0 | 0 | 0 | 0 | 0 | 16 | 16 | 16 | 16 | 0 | 0 | 0 | 16 | 16 | 16 | 16 | 16 |
| V<4> | 0 | 0 | 0 | 0 | 0 | 0 | 0 | 0 | 16 | 0 | 0 | 0 | 0 | 0 | 0 | 0 | 16 |
| | | | | | | | TAIL CURRENT RATIO | | | | | | | | | | |
| m<1> | 1 | 0.25 | 0.5 | 0.75 | 1 | 1.25 | 1.5 | 1.75 | 1 | 0.25 | 0.5 | 0.75 | 1 | 1.25 | 1.5 | 1.75 | 1 |
| m<2> | 1 | 1 | 1 | 1 | 1 | 1 | 1 | 1 | 1 | 1 | 1 | 1 | 1 | 1 | 1 | 1 | 1 |
| m<3> | 1 | 1.75 | 1.5 | 1.25 | 1 | 0.75 | 0.5 | 0.25 | 1 | 1.75 | 1.5 | 1.25 | 1 | 0.75 | 0.5 | 0.25 | 1 |
| m<4> | 1 | 1 | 1 | 1 | 1 | 1 | 1 | 1 | 1 | 1 | 1 | 1 | 1 | 1 | 1 | 1 | 1 |
| | | | | | | | | OUTPUT VOLTAGE LEVEL | | | | | | | | |
| Vout | 0 | 1 | 2 | 3 | 4 | 5 | 6 | 7 | 8 | 9 | 10 | 11 | 12 | 13 | 14 | 15 | 16 |

FIG. 10B

| | | | | | | | | | DIGITAL DATA DT | | | | | | | | |
|---|---|---|---|---|---|---|---|---|---|---|---|---|---|---|---|---|---|
| D3 | 0 | 0 | 0 | 0 | 0 | 0 | 0 | 0 | 1 | 1 | 1 | 1 | 1 | 1 | 1 | 1 | 1 |
| D2 | 0 | 0 | 0 | 0 | 1 | 1 | 1 | 1 | 0 | 0 | 0 | 0 | 1 | 1 | 1 | 1 | 1 |
| D1 | 0 | 0 | 1 | 1 | 0 | 0 | 1 | 1 | 0 | 0 | 1 | 1 | 0 | 0 | 1 | 1 | 1 |
| D0 | 0 | 1 | 0 | 1 | 0 | 1 | 0 | 1 | 0 | 1 | 0 | 1 | 0 | 1 | 0 | 1 | 0 |

| | | | | | | | | NON-INVERTING INPUT TERMINAL INPUT VOLTAGE | | | | | | | | | |
|---|---|---|---|---|---|---|---|---|---|---|---|---|---|---|---|---|---|
| V<1> | 0 | 16 | 16 | 16 | 16 | 16 | 16 | 16 | 16 | 16 | 16 | 16 | 16 | 16 | 16 | 16 | 16 |
| V<2> | 0 | 0 | 0 | 16 | 16 | 16 | 16 | 0 | 16 | 16 | 16 | 16 | 16 | 16 | 16 | 16 | 16 |
| V<3> | 0 | 0 | 0 | 0 | 0 | 16 | 0 | 0 | 0 | 16 | 16 | 16 | 0 | 0 | 16 | 16 | 16 |
| V<4> | 0 | 0 | 0 | 0 | 0 | 0 | 0 | 0 | 0 | 0 | 0 | 16 | 0 | 0 | 0 | 16 | 16 |

| | | | | | | | | TAIL CURRENT RATIO | | | | | | | | | |
|---|---|---|---|---|---|---|---|---|---|---|---|---|---|---|---|---|---|
| m<1> | 0.25 | 0.25 | 0.25 | 0.75 | 0.25 | 1.25 | 0.75 | 1.75 | 0.25 | 1.25 | 0.25 | 1.25 | 0.75 | 1.25 | 0.25 | 1.25 | 0.25 |
| m<2> | 1.75 | 0.25 | 0.25 | 1.25 | 0.75 | 1.75 | 0.25 | 1.75 | 0.25 | 1.75 | 0.25 | 1.75 | 0.75 | 1.75 | 0.25 | 1.75 | 1.75 |
| m<3> | 1.75 | 1.75 | 1.25 | 1.25 | 1.25 | 1.25 | 1.75 | 1.75 | 1.75 | 1.75 | 0.75 | 0.75 | 1.75 | 1.25 | 0.25 | 0.25 | 1.75 |
| m<4> | 0.25 | 1.75 | 1.75 | 0.75 | 1.75 | 0.25 | 1.25 | 0.25 | 1.75 | 0.25 | 1.75 | 0.25 | 0.75 | 0.25 | 0.25 | 0.25 | 0.25 |

| | | | | | | | | OUTPUT VOLTAGE LEVEL | | | | | | | | | |
|---|---|---|---|---|---|---|---|---|---|---|---|---|---|---|---|---|---|
| Vout | 0 | 1 | 2 | 3 | 4 | 5 | 6 | 7 | 8 | 9 | 10 | 11 | 12 | 13 | 14 | 15 | 16 |

FIG. 11

| (M-N) BITS | | N BITS (N = 3, K IS POSITIVE NUMBER EQUAL TO OR SMALLER THAN 2) | | OUTPUT LEVEL |
|---|---|---|---|---|
| VA | VB | NON-INVERTING INPUT TERMINAL INPUT VOLTAGE | TAIL CURRENT RATIO | |
| 0 | 8 | SELECTION OF COMBINATION OF V<1> TO V<$2^k$> | SWITCHING CONTROL OF THREE VALUES OR MORE | 1~8 |
| 8 | 16 | SAME AS ABOVE | SAME AS ABOVE | 9~16 |
| 16 | 24 | SAME AS ABOVE | SAME AS ABOVE | 17~24 |
| 24 | 32 | SAME AS ABOVE | SAME AS ABOVE | 25~32 |
| ..... | ..... | ..... | ..... | ..... |

FIG. 14

DIGITAL-TO-ANALOG CONVERSION CIRCUIT, DATA DRIVER, AND DISPLAY DEVICE

CROSS-REFERENCE TO RELATED APPLICATION

This application claims the priority benefit of Japan application serial no. 2022-153272, filed on Sep. 27, 2022. The entirety of the above-mentioned patent application is hereby incorporated by reference herein and made a part of this specification.

BACKGROUND

Technical Field

The present disclosure relates to a digital-to-analog conversion circuit, a data driver including this digital-to-analog conversion circuit, and a display device including this data driver.

Description of Related Art

Currently, as a display device of an active matrix type, a liquid crystal display device, an organic EL display device, and the like are in the mainstream. In such a display device, together with a display panel in which data lines and scanning lines are wired to intersect each other, and display cells connected to the data lines through pixel switches are arranged in a matrix pattern, a data driver supplying analog voltage signals corresponding to a gray scale level to the data lines of the display panel and a scanning driver supplying scanning signals used for controlling on/off of each pixel switch to the scanning lines of the display panel are mounted. In the data driver, a digital-to-analog conversion part that converts a video digital signal into analog voltages corresponding to a luminance level and supplies voltage signals acquired by amplifying these analog voltages to the data lines of the display panel is included.

Hereinafter, a schematic configuration of the data driver will be described.

The data driver, for example, includes a shift register, a data register latch, a level shifter, and a digital-to-analog conversion part.

The shift register generates latch timing signals used for selecting latches in synchronization with a clock signal and supplies the generated latch timing signals to the data register latch in accordance with a start pulse supplied from a display controller. The data register latch takes in video digital data supplied from the display controller for every predetermined S pieces (here, S is an integer of two or more) on the basis of latch timing signals supplied from the shift register and supplies the S video digital data signals to the level shifter. The level shifter supplies S video digital data signal after a level shift acquired by performing level shift processing for increasing a signal amplitude on each of S video digital data signals supplied from the data register latch to the digital-to-analog conversion part.

The digital-to-analog conversion part includes a reference voltage group generating part, a decoder part, and an amplification part.

The reference voltage group generating part generates reference voltages of which voltage values are different from each other and supplies the generated reference voltages to the decoder part. For example, the reference voltage group generating part supplies division voltages acquired by dividing at least two reference power supply voltages using a ladder resistor to the decoder part as a reference voltage group.

The decoder part includes S decoders disposed in correspondence with respective outputs of the data driver. Each of the decoders receives supply of a reference voltage group generated by the reference voltage group generating part and receives a video digital data signal supplied from the level shifter, selects a reference voltage corresponding to this video digital data signal from among reference voltages, and supplies the selected reference voltage to the amplification part.

The amplification part includes S differential amplifiers each amplifying a reference voltage selected by each decoder of the decoder part and outputting a resultant voltage.

However, in the digital-to-analog conversion part, the more the number of reference voltages generated by the reference voltage group generating part, the more the number of grayscales of luminance levels (the number of colors) that can be expressed can be increased. However, when the number of reference voltages generated by the reference voltage group generating part is increased, a wiring area and the number of switching elements included in decoders selecting a reference voltage are also increased in correspondence therewith, and a chip size of the data driver (a manufacturing cost) is increased.

Thus, a digital-to-analog converter employing a differential amplifier capable of outputting three or more voltage values by dividing (interpolating) two reference voltages selected on the basis of a luminance level with predetermined weights as the differential amplifier described above has been proposed (for example, see Patent Document 1: Japanese Patent Application Laid-Open No. 2002-43944).

In Patent Document 1, a differential amplifier of a negative feedback type outputting an output voltage having one voltage value among four voltage values dividing two reference voltages into four voltages and a digital-to-analog converter using that have been proposed.

Such a differential amplifier includes four differential pairs driven with the same tail current each having its output voltage being commonly fed back and input to inverting input terminals, being connected to its non-inverting input terminal, and receiving one out of two reference voltages with a weight of 1:1:2. This differential amplifier inputs one out of two reference voltages to a non-inverting input terminal of each differential pair in accordance with data of lower two bits of a digital data signal and outputs an output voltage having any one voltage value of four voltage levels dividing the two reference voltages into four voltages. In addition, a digital-to-analog converter including this differential amplifier, by selecting two reference voltages adjacent to each other from among a reference voltage group of every four grayscales in accordance with data of an upper bit group of a digital data signal, can output a voltage level that is four times (F−1) for a voltage number F of the reference voltage group from this differential amplifier.

However, in the digital-to-analog converter disclosed in Patent Document 1, the number of differential pairs of the differential amplifier and the number of voltage levels dividing two input voltages (reference voltages) are the same.

In a case in which a differential amplifier in which the number of acquired voltage levels is increased by increasing a division number of two input voltages (reference voltages) using the principle of the digital-to-analog converter disclosed in Patent Document 1 is used for reducing the area of the digital-to-analog converter of multiple bits, the number of elements of a decoder selecting two input voltages (reference voltages) is decreased, and the number of differential pairs of the differential amplifier is increased in units of a power of 2, and thus the number of elements of the differential amplifier is significantly increased. Thus, it is possible that reduction of the area of the digital-to-analog converter cannot be realized as expected.

SUMMARY

According to an embodiment, there is provided a digital-to-analog conversion circuit that is a digital-to-analog conversion circuit converting digital data of N (N is a positive number equal to or greater than 3) bits into an analog output voltage and outputting the output voltage, the digital-to-analog conversion circuit including: a differential amplifier having a plurality of input terminals and outputting the output voltage from an output terminal in accordance with a calculation result based on voltages received at the plurality of input terminals; and a first decoder receiving first and second voltages and distributing and supplying one of the first and second voltages to each of the plurality of input terminals of the differential amplifier on the basis of the digital data of the N bits, in which the differential amplifier includes $2^K$ (K is a positive number satisfying N>K) differential pairs each including an inverting input terminal to which the output voltage is commonly input and a non-inverting input terminal to which one of voltages received by the plurality of input terminals is input, the differential pairs being driven by tail currents respectively and having output pairs commonly connected with each other, an amplification stage generating the output voltage in accordance with an amplification operation based on an output signal of one or both of the output pairs of the $2^K$ differential pairs that are commonly connected, and a tail current control circuit supplying the tail currents respectively to the $2^K$ differential pairs on the basis of a predetermined bit of the digital data of the N bits and individually controlling current ratios of the tail currents with respect to a reference current value for the respective differential pairs, and the differential amplifier outputs one of voltage levels dividing the first voltage and the second voltage into $2^N$ parts as the output voltage in accordance with the digital data of the N bits.

According to an embodiment, there is provided a data driver including a plurality of the digital-to-analog conversion circuits described above, the data driver converting video digital data pieces representing luminance levels of pixels using digital values into a plurality of output voltages respectively having analog voltage values using the plurality of the digital-to-analog conversion circuits and supplying a plurality of drive signals respectively having the plurality of output voltages to a plurality of data lines of a display panel, respectively.

According to an embodiment, there is provided a display device including: a display panel having a plurality of data lines to which a plurality of display cells are connected respectively; and a data driver including a plurality of the digital-to-analog conversion circuits described above, converting video digital data pieces representing luminance levels of pixels using digital values into a plurality of output voltages respectively having analog voltage values using the plurality of the digital-to-analog conversion circuits, and supplying a plurality of drive signals respectively having the plurality of output voltages to the plurality of data lines of the display panel, respectively.

The present disclosure is a digital-to-analog conversion circuit that converts 3 bits or more digital data into an analog output voltage and outputs the output voltage, the digital-to-analog conversion circuit including a differential amplifier having a plurality of differential pairs receiving voltages received at a plurality of input terminals and a feedback output voltage as differential inputs and a decoder distributing and supplying one of first and second voltages to a plurality of input terminals of the differential amplifier on the basis of digital data, and the differential amplifier includes the following tail current control circuit. The tail current control circuit supplies tail currents to the plurality of differential pairs described above and controls tail current ratios of a plurality of differential pairs on the basis of a predetermined bit of the digital data. In accordance with this, the number of voltage levels of the output voltage can be increased using a smaller number of differential pairs, whereby area reduction can be realized.

Thus, according to the present disclosure, area reduction of a multi-bit digital-to-analog converter can be realized.

In addition, by using such a digital-to-analog converter in a data driver converting video data of a digital value into an analog voltage level, miniaturization of this data driver and a display device including this data driver can be realized.

BRIEF DESCRIPTION OF THE DRAWINGS

FIG. 2 is a diagram illustrating an example of a first specification of a digital-to-analog converter 100.

FIG. 4A is a diagram illustrating a part of a second specification of the digital-to-analog converter 100.

FIG. 4B is a diagram illustrating a part of a third specification of the digital-to-analog converter 100.

FIG. 4C is a diagram illustrating a part of a fourth specification of the digital-to-analog converter 100.

FIG. 5A is a diagram illustrating an example of a specification of a case in which N=3 and K=2 in the digital-to-analog converter 100A.

FIG. 5B is a diagram illustrating another example of a specification of a case in which N=3 and K=2 in the digital-to-analog converter 100A.

FIG. 5C is a diagram illustrating another example of a specification of a case in which N=3 and K=2 in the digital-to-analog converter 100A.

FIG. 5D is a diagram illustrating another example of a specification of a case in which N=3 and K=2 in the digital-to-analog converter 100A.

FIG. 7A is a diagram illustrating another example of the specification of a case in which N=4 and K=3 in the digital-to-analog converter 100A.

FIG. 7B is a diagram illustrating further another example of the specification of a case in which N=4 and K=3 in the digital-to-analog converter 100A.

FIG. 8 is a diagram illustrating an example of the specification of a case in which N=3 and K=1 in the digital-to-analog converter 100A.

FIG. 10A is a diagram illustrating an example of the specification of a case in which N=4 and K=2 in the digital-to-analog converter 100A.

FIG. 10B is a diagram illustrating another example of the specification of a case in which N=4 and K=2 in the digital-to-analog converter 100A.

FIG. 11 is a diagram illustrating an example of the specification of a case in which N=4 and K=2 in the digital-to-analog converter 100.

FIG. 14 is a diagram illustrating a specification corresponding to FIG. 5A, 5C, 5D, or 8 in the digital-to-analog converter 150.

DESCRIPTION OF THE EMBODIMENTS

Embodiments of the present disclosure provide a digital-to-analog conversion circuit of multiple bits, a data driver including this digital-to-analog conversion circuit, and a display device capable of reducing the area.

Figure 1:
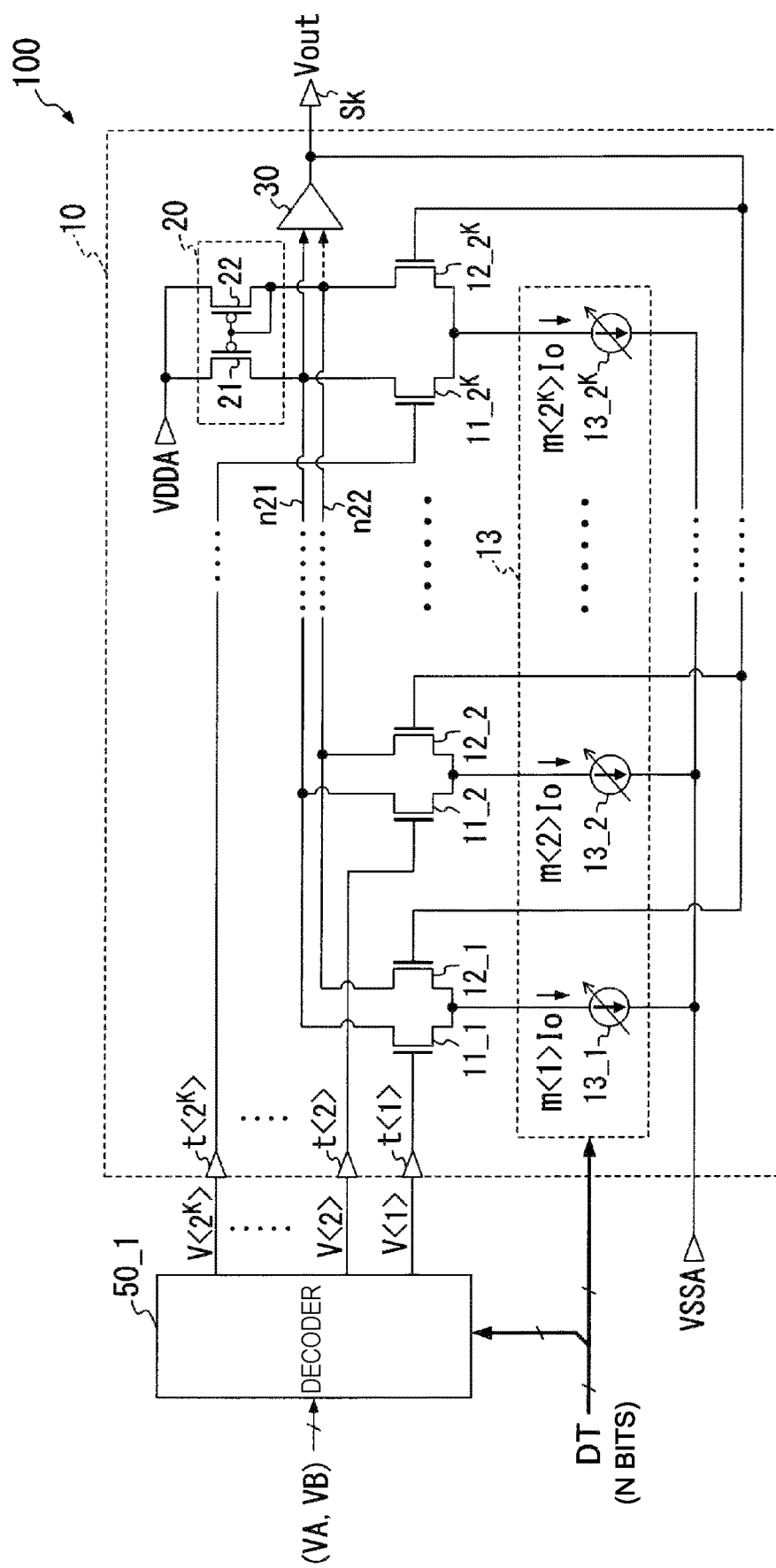
FIG. 1 is a circuit diagram illustrating the configuration of a digital-to-analog converter 100 according to the present disclosure.

FIG. 1 is a circuit diagram illustrating the configuration of a digital-to-analog converter 100 according to the present disclosure.

The digital-to-analog converter 100 includes a decoder 50_1 and a differential amplifier 10 and receives digital data DT of N bits (here, N is a positive number equal to or greater than 3), converts this into an output voltage Vout having an analog voltage value, and outputs the output voltage.

The decoder 50_1 receives digital data DT and two voltages VA and VB formed from mutually-different voltage values. The decoder 50_1 selects a combination for distributing the two voltages VA and VB to input terminals t<1> to t<$2^K$> of the differential amplifier 10 on the basis of the digital data DT. Here, K is a positive number equal to or greater than 1 satisfying N>K.

The decoder 501 supplies an input voltage representing one of the voltages VA and VB according to this selected combination to the input terminals t<1> to t<$2^K$> of the differential amplifier 10.

The differential amplifier 10 amplifies and outputs a voltage level acquired by dividing a voltage between the voltages VA and VB into $2^N$ voltages in accordance with a combination of $2^K$ voltages (VA or VB) received by the input terminals t<1> to t<$2^K$> as an output voltage Vout.

The differential amplifier 10 includes $2^K$ differential pairs (11_1, 12_1) to (11_$2^K$, 12_$2^K$) of a same conductivity type (an N-channel type in FIG. 1) to which a tail current is supplied and of which output pairs are commonly connected, a tail current control circuit 13 that supplies a tail current to each of $2^K$ differential pairs and variably controls a tail current ratio of the differential pairs on the basis of a predetermined bit of the digital data DT, a current mirror circuit 20, and an amplification stage 30.

The current mirror circuit 20 includes transistors 21 and 22 of a P channel type, of which gates are connected together, having the same size. A high potential power supply voltage VDDA is applied to a source of each of the transistors 21 and 22. In addition, a drain of the transistor 21 is connected to a node n21, and a gate and a drain of the transistor 22 are connected to a node n22. Furthermore, the nodes n21 and n22 are respectively connected to the output pairs of $2^K$ differential pairs that are commonly connected.

In accordance with such a configuration, the current mirror circuit 20 operates as a common load of $2^K$ differential pairs. In addition, the amplification stage 30 outputs an output voltage generated by causing an amplification operation by receiving an output signal of one or both of the output pairs (the nodes n21 and n22) of $2^K$ differential pairs that are commonly connected to an output terminal Sk.

The output voltage Vout is fed back and input to the inverting input terminals of $2^K$ differential pairs (11_1, 12_1) to (11_$2^K$, 12_$2^K$), that is, gates of the transistors 12_1 to 12_$2^K$ of the N channel type (hereinafter, also referred to differential pair transistors). Voltages (VA or VB) received by the input terminals t<1> to t<$2^K$> are supplied to the non-inverting input terminals of the differential pairs (11_1, 12_1) to (11_$2^K$, 12_$2^K$), that is, the gates of the transistors 11_1 to 11_$2^K$ of the N-channel type (hereinafter, also referred to as differential pair transistors).

The transistors 11_1 to 11_$2^K$ have the same characteristics, and drains thereof are commonly connected using the node n21. The transistors 12_1 to 12_$2^K$ have the same characteristics, and drains thereof are commonly connected using the node n22. In other words, $2^K$ differential pairs (11_1, 12_1) to (11_$2^K$, 12_$2^K$) are formed to have a parallel-form connection configuration in which output pairs are commonly connected.

In addition, a case in which $2^K$ differential pairs (11_1, 12_1) to (11_$2^K$, 12_$2^K$) according to each example of the present disclosure are configured using differential pair transistors having equivalent characteristics will be described. In an actual configuration, for example, although there is a case in which an equivalent change acquired by substituting differential pairs, of which inputs are common, with one differential pair in which the size of the differential pair transistor is changed can be made, for the convenience of description, characteristics of differential pair transistors of differential pairs are assumed to be the same, and a configuration equivalent thereto is assumed to belong to the present disclosure. As the simplest specific example, all the differential pair transistors of the differential pairs (11_1, 12_1) to (11_$2^K$, 12_$2^K$) are configured to have the same size.

Here, sources of transistors of the differential pairs (11_1, 12_1) to (11_$2^K$, 12_$2^K$) are connected to each other, and the differential pairs are individually connected to the tail current control circuit 13.

The tail current control circuit 13 includes variable current sources 13_1 to 13_$2^K$ that are respectively connected between sources of the differential pairs (11_1, 12_1) to (11_$2^K$, 12_$2^K$) and a low potential power supply voltage VSSA. The variable current sources 13_1 to 13_$2^K$ respectively set tail currents to be supplied to the sources of the differential pairs (11_1, 12_1) to (11_$2^K$, 12_$2^K$).

More specifically, the variable current sources 13_1 to 13_$2^K$ respectively control tail current ratios in accordance with current ratios of three or more values including at least a reference current ratio 1 with reference to a predetermined reference current value Jo on the basis of a predetermined bit of the digital data DT.

In addition, although the tail current control circuit 13 can change all the currents of the variable current sources 13_1 to 13_$2^K$, as a specific example in which control can be easily performed, a control method of only performing variable control of currents of at least predetermined two variable current sources can be performed. In addition, in order to maintain a through rate (a voltage change amount per unit time) at the time of a voltage change of the output voltage Vout of the differential amplifier 10 to be constant without being dependent on a voltage level, each tail current ratio is controlled such that a total or an average of tail current ratios controlled by the variable current sources 13_1 to 13_$2^K$ becomes constant or approximately constant without being dependent on a voltage level.

The amplification stage 30 generates an output voltage Vout in accordance with an amplification operation based on an output signal of one or both of the nodes n21 and n22 forming a commonly-connected output pair of the $2^K$ differential pairs (11_1, 12_1) to (11_$2^K$, 12_$2^K$). In other words, differential output currents of differential pairs corresponding to a combination of $2^K$ voltages (VA or VB) received by the input terminals t<1> to t<$2^K$> and a combination of tail current ratios of the variable current sources 13_1 to 13_$2^K$ are combined at the nodes n21 and n22, and, in accordance with an operational amplification operation of the amplification stage 30 based on an output signal of one or both of the nodes n21 and n22, any one of voltage levels dividing between the voltages VA and VB into $2^N$ voltages is amplified and output as the output voltage Vout described above.

Hereinafter, an amplification operation of the differential amplifier 10 illustrated in FIG. 1 will be described.

For the convenience of description, input voltages of non-inverting input terminals of the differential pairs (11_1, 12_1) to (11_$2^K$, 12_$2^K$) will be denoted as V<1> to V<$2^K$>. In addition, setting currents of the variable current sources 13_1 to 13_$2^K$ supplying tail currents to the differential pairs (11_1, 12_1) to (11_$2^K$, 12_$2^K$) will be denoted as m<1>Io to m<$2^K$>Io. Here, m<1> to m<$2^K$> maintain a current ratio total to be approximately constant using coefficients of the tail current ratios having the reference current ratio 1 with respect to a reference current value Jo, and thus the following is satisfied.

m<1>+m<2>+ . . . +m<$2^K$>=$2^K$ (1), and, for the convenience of calculation, when $2^K$=n, it is represented as m<1>+m<2>+ . . . +m<n>=n (1a).

In addition, for the i-th n (=$2^K$) differential pairs, when a current of the differential pair transistor of the non-inverting input terminal side is Iai, and a current of the differential pair transistor of the inverting input terminal side is Ibi.

$$Iai=Is+gmi(V<i>-Vs) \quad (2)$$

$$Ii=Is+gmi\cdot(Vout-Vs) \quad (3).$$

Is and Vs represent predetermined operating points within a voltage range in which linear approximation on an IV characteristic curve of the differential pair transistor can be performed, and V<i>, Vout represents a voltage near Vs (within a linear approximation range). In addition, a mutual conductance gm of operating points of the differential pair transistors of a non-inverting input terminal side and an inverting input terminal side will be denoted as gmi.

Here, when a current weighting ratio of a current supplied to the i-th differential pair is m<i>, Equations (2) and (3) described above become the following relational expression.

$$m<i>Iai=m<i>Is+gmim<i>(V<i>-Vs) \quad (4)$$

$$m<i>Ibi=m<i>Is+gmim<i>(Vout-Vs) \quad (5)$$

When a difference between Equations (4) and (5) is taken, the following equation is obtained.

$$m<i>(Iai-Ibi)=gmim<i>(V<i>-Vout) \quad (6)$$

Furthermore, a variation of an operating point with respect to a variation of a current weighting ratio in a current supplied to each differential pair (an arbitrary i value) is also caused to be within a linear approximation range, gm can be approximated to be constant (gmi=gm).

When left sides of Equation (6) are added for I=1 to n, and right sides thereof are added, the following equations are formed.

$$\text{Left side}=(m<1>Ia1+ \ldots +m<n>Ian)-(m<1>Ib1+ \ldots +m<n>Ibn) \quad (7)$$

$$\text{Right side}=gm((m<1>V<1>+ \ldots +m<n>V<n>)-(m<1>+ \ldots +m<n>)Vout)) \quad (8)$$

Here, the left side described above is a difference between a total current of the differential pair transistors of the non-inverting input terminal side and a total current of the differential pair transistors of the inverting input terminal side and corresponds to a relation between an input current and an output current of the current mirror circuit 20. At this time, since the total current of the differential pair transistors of the non-inverting input terminal side and the total current of the differential pair transistors of the inverting input terminal side are the same, the difference between the total currents becomes zero, in other words, the left side described above becomes zero.

On the other hand, the coefficient (m<1>+ . . . +m<n>) of the output voltage Vout on the right side becomes a constant value (=$2^K$) in accordance with Equation (1a) and is represented as below in accordance with Equations (7) and (8).

$$Vout=(m<1>V<1>+ \ldots +m<n>V<n>)/n \quad (9)$$

Here, when n is returned to $2^K$, the output voltage Vout can be represented using the following equation.

$$Vout=(m<1>V<1>+ \ldots +m<2^K>V<2^K>)/(m<1>+ \ldots +m<2^K>) \quad (10)$$

As above, the output voltage Vout of the differential amplifier 10 illustrated in FIG. 1, as represented in this Equation (10), for an input voltage of a non-inverting input terminal of each differential pair, becomes a weighted average value of an integrated value of a weighting factor of the input voltage and a weighing factor of the tail current ratio.

In addition, in Equation (10), an average of the tail current ratios m<1> to m<$2^K$> has a reference value of 1, and a tail current ratio total (or an average) is regarded to be approximately constant.

Thus, the output voltage Vout represented in Equation (10) takes multi-value voltages equally dividing between the voltages VA and VB in accordance with a combination of two voltages (VA and VB) supplied to the non-inverting input terminals of the differential pair and a combination of tail current ratios of differential pairs. Among them, in accordance with an optimal combination of two voltages (VA and VB) and an optimal combination of tail current ratios, voltage levels equally dividing between the voltages VA and VB into $2^N$ parts can be generated.

Hereinafter, a further detailed configuration of the digital-to-analog converter 100 illustrated in FIG. 1 that amplifies and outputs the output voltage Vout based on Equation (10) will be described with reference to FIG. 2.

FIG. 2 is a diagram representing relations among the number of bits of digital data DT, the number of differential pairs, the number of switching levels of a tail current ratio, and the number of output levels dividing between voltages VA and VB that can be output by the differential amplifier 10, which are constituent elements of the digital-to-analog converter 100 according to the embodiment illustrated in FIG. 1.

Here, for example, in a case in which the number N of bits of the digital data DT is three bits, the number of levels ($2^N$) of the output voltage described above becomes 8, and thus 8 differential pairs are necessary in a conventional digital-to-analog converter disclosed in Patent Document 1.

In the digital-to-analog converter 100 illustrated in FIG. 1, by performing switching control of the number of levels of the tail current ratios of differential pairs to be 3 levels (three values) or more, as illustrated in FIG. 2, even when the number of differential pairs is reduced to be ½ of that of a conventional case or less, 8 output voltage levels can be generated.

By reducing the number of differential pairs of the differential amplifier 10 as such, the number of combination patterns of two voltages (VA and VB) selected by the decoder 50_1 is decreased as well, and thus also the number of elements of the decoder 50_1 can be decreased, whereby reduction of the area of the digital-to-analog converter 100 can be achieved.

Thus, according to the present disclosure, by inhibiting an increase of the circuit scale of a digital-to-analog converter acquiring multi-value voltage levels dividing between two voltages (VA and VB), an increase in the chip area can be inhibited.

The output voltage Vout acquired using Equation (10) is on the basis of a premise condition that a variation of an operating point on a characteristic curve of each differential pair transistor with respect to the input voltage V<i> (here, i=1 to $2^K$), the output voltage Vout, and the tail current ratio is within a linear approximation range. At this time, although a voltage difference between the voltages VA and VB is set to be sufficiently small, in accordance with required accuracy of an output voltage, fine adjustment of the input voltage and the tail current ratio may be performed.

In addition, the current mirror circuit 20 included in the differential amplifier 10 illustrated in FIG. 1 is not limited to the configuration illustrated in FIG. 1 and may be replaced with an arbitrary current mirror circuit of a cascade type or the like.

In addition, the differential pair included in the differential amplifier 10 is not limited to an N-channel type differential pair and may be configured to include a P-channel-type differential pair or differential pairs of both conductivity types of the N channel type and the P channel type. In each embodiment described below, for the convenience of description, although a configuration example including $2^K$ N-channel type differential pairs similar to those illustrated in FIG. 1 will be described, it is apparent that the partial replacement described above can be similarly performed as the differential amplifier 10.

Next, a modified example of the digital-to-analog converter 100 illustrated in FIG. 1 will be described.

Figure 3:
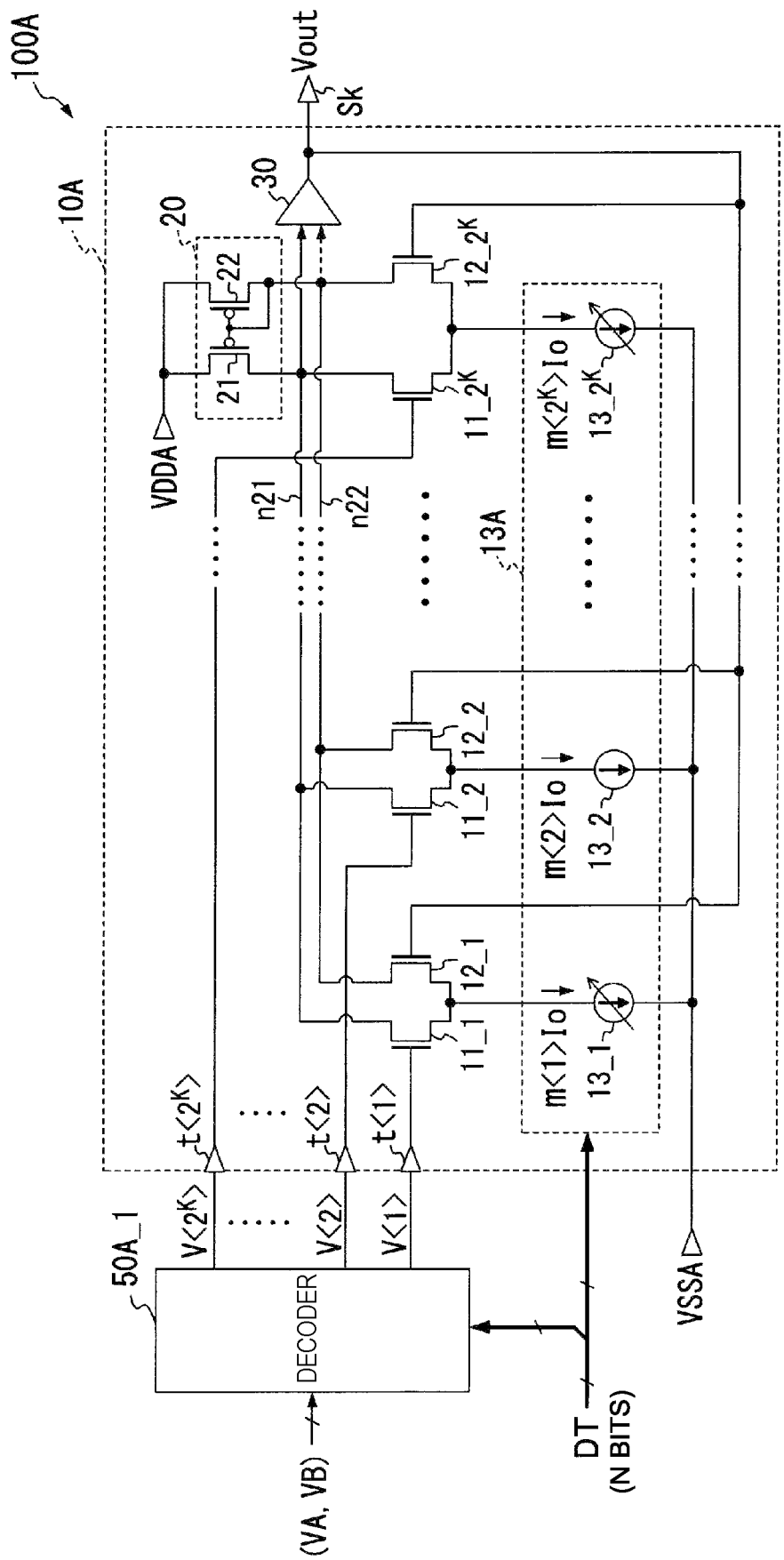
FIG. 3 is a circuit diagram illustrating the configuration of a digital-to-analog converter 100A according to the present disclosure.

FIG. 3 is a circuit diagram illustrating the configuration of a digital-to-analog converter 100A as a modified example of the digital-to-analog converter 100 illustrated in FIG. 1.

In the configuration illustrated in FIG. 3, configurations other than replacement of the tail current control circuit 13 with a tail current control circuit 13A are the same as those illustrated in FIG. 1.

Compared to the tail current control circuit 13, in the tail current control circuit 13A, there are only predetermined two differential pairs of which a tail current ratio can be controlled to be switched among $2^K$ differential pairs, and tail current ratios of the other differential pairs are fixed.

In other words, in the example illustrated in FIG. 3, only variable current sources 13_1 and 13_$2^K$ among variable current sources 13_1 to 13_$2^K$ respectively generating tail currents of differential pairs (11_1, 12_1) to (11_$2^K$, 12_$2^K$) perform switching control of tail current ratios with three values or more. In other words, in the remaining variable current sources 13_2 to 13_($2^K$-1), current values are controlled to have a fixed tail current ratio (constant current sources 13_2 to 13_($2^K$_1)).

Predetermined two differential pairs of which tail current ratios are controlled to be switched are assumed to include one differential pair to which the voltage VA is input and one differential pair to which the voltage VB is input for output voltage levels except for the same voltage values as two voltage (VA and VB). In addition, the predetermined two differential pairs of which tail current ratios are controlled to be switched may be interchanged between differential pairs of which input voltages are the same.

Next, a further detailed specific example of the digital-to-analog converter 100 (100A) illustrated in FIG. 1 (FIG. 3) will be described.

Major specific examples can be largely classified into three Embodiments 1 to 3 and are illustrated in FIGS. 4A to 4C.

FIGS. 4A to 4C illustrate constituent elements of an embodiment of three systems in which tail current ratios of differential pairs illustrated in FIG. 2 are three values, seven values, and four values.

First, according to Embodiment 1 illustrated in FIG. 4A, by setting a tail current ratio of 3 values, the number of differential pairs required for acquiring $2^N$ output levels dividing between the voltages VA and VB in accordance with digital data DT of N bits (N≥3) can be configured to be $2^K$ (here, K=N−1) that is ½ of that of a conventional configuration.

Next, according to Embodiment 2 illustrated in FIG. 4B, by setting a tail current ratio of 7 values, the number of differential pairs required for acquiring $2^N$ output levels dividing between the voltages VA and VB in accordance with digital data DT of N bits (N≥3) can be configured to be $2^K$ (here, K=N−2) that is ¼ of that of a conventional configuration.

In addition, according to Embodiment 3 illustrated in FIG. 4C, by setting a tail current ratio of 4 values, the number of differential pairs required for acquiring $2^N$ output levels dividing between the voltages VA and VB in accordance with digital data DT of N bits (N≥4) can be configured to be $2^K$ (here, K=N−2) that is ¼ of that of a conventional configuration.

Hereinafter, examples of the embodiments corresponding to FIGS. 4A to 4C will be described with reference to the drawings.

Embodiment 1/Example 1-1-1

FIG. 5A is a diagram illustrating an example of a specification of a case in which N=3 and K=2 in the digital-to-analog converter 100A illustrated in FIG. 3. In accordance with this, a decoder 50A_1 illustrated FIG. 3 selects a combination for distributing voltages (VA and VB) into four terminals on the basis of digital data DT of 3 bits. A differential amplifier 10A has four (K=2) differential pairs connected in parallel, non-inverting input terminals thereof are connected to four terminals, and a combination of voltages (VA and VB) selected by the decoder 50A_1 is input as input voltages V<1> to V<4>. The tail current control circuit 13A performs control of two tail current ratios m<1> and m<4> among tail current ratios m<1> to m<4> of tail currents supplied to four differential pairs (11_1, 12_1) to (11_4, 12_4) to be three values of (0.5:1:1.5) in accordance with lower two bits (D1, D0) of the digital data DT and performs control of the tail current ratios m<2> and m<3> to be a fixed value of 1. In accordance with the configuration described above, an output voltage Vout acquired in a case in which K=2 in Equation (10) represented above is output.

In addition, FIG. 5A illustrates a specification at the time of outputting a total of 8 levels (output levels 1 to 8) including levels 1 to 7 and one of voltages VA and VB (levels 0 and 8) among levels 0 to 8 dividing between the voltages VA and VB (levels 0 and 8) into 8 parts in accordance with digital data DT of three bits. In FIG. 5A, for simplification of description, the voltages (VA and VB) are set as voltage levels (0 and 8), and the output voltage Vout will be described as output levels 0 to 8. It is apparent that a relation between an input voltage level and an output voltage level also follows a calculation equation acquired by setting K=2 in Equation (10) represented above.

In addition, FIG. 5A illustrates a specification in which input voltages V<1> to V<4> of the differential amplifier 10A are different from each other for the digital data DT of three bits. In other words, for the output levels 1 to 7 between 2 voltages VA and VB (the levels 0 and 8), V<1> is set only to the voltage VB (the level 8), and V<4> is set only to the voltage VA (the level 0). In addition, two differential pairs for which switching control of a tail current ratio is performed includes one differential pair to which only the voltage VA (the level 0) out of two voltages (VA and VB) in output levels 1 to 7 is input (receiving V<4>) and one differential pair to which only the voltage VB (the level 8) is input (receiving V<1>). At this time, in accordance with digital data, tail current ratios m<1> and m<4> of two differential pairs receiving V<1> and V<4> are switched to three values (0.5:1:1.5). In addition, the three values may be (1:2:3). For the convenience of description, a ratio in which an average of the tail current ratios becomes 1 is represented in FIG. 5A. In addition, in the switching control of three values of tail current ratios, among output levels 1 to 7, a tail current ratio of 0.5 or 1.5 is set at the time of an odd numbered output level from an output level (level 0 or 8) that is the same as the voltage VA or VB, and a tail current ratio of 1 is set at the time of an even numbered output level.

At this time, one value (a ratio of 1) is assigned to tail current ratios m<2> and m<3> of differential pairs receiving input voltages V<2> and V<3> regardless of digital data DT, and the voltage VA (the level 0) or the voltage VB (the level 8) satisfying Equation (10) for the output levels 1 to 7 is input to the voltages V<2> and V<3>.

In addition, for each of output levels (the levels 0 and 8) that is the same as the voltage VA or VB, only one of the voltage VA or VB is input to the input voltages V<1> to V<4>, and thus one value (a ratio of 1) is assigned to the tail current ratio of each differential pair.

As above, in the specification of FIG. 5A, the digital-to-analog converter 100A including the differential amplifier 10A that has four differential pairs and performs switching control of predetermined two tail current ratios to three values using the tail current control circuit 13A amplifies and outputs an output voltage Vout of 8 levels among output levels dividing between the voltages VA and VB into 8 parts on the basis of digital data DT of three bits.

Embodiment 1/Example 1-1-2

FIG. 5B, similar to FIG. 5A, is a diagram illustrating another example of a specification of a case in which N=3 and K=2 in the digital-to-analog converter 100A illustrated in FIG. 3. FIG. 5B illustrates a specification at the time of outputting output levels 0 to 7 (a total of 8 levels) formed from the levels 1 to 7 and one voltage VA (level 0) of two voltages (VA and VB) among levels 0 to 8 dividing between the voltages VA and VB (the levels 0 and 8) into 8 parts in accordance with digital data DT of three bits. Thus, on the basis of the digital data DT of three bits, the decoder 50A_1 selects a combination for distributing voltages (VA and VB) to four terminals (non-inverting input terminals of differential pairs). Matters other than assignment of output voltage levels for the digital data DT of three bits are similar to those illustrated in FIG. 5A.

In addition, in FIG. 5B, similar to FIG. 5A, the digital-to-analog converter 100A including the differential amplifier 10A that has four differential pairs and performs switching control of predetermined two tail current ratios into three values using the tail current control circuit 13A amplifies and outputs an output voltage Vout of 8 levels among output levels dividing between the voltages VA and VB into 8 parts on the basis of digital data DT of three bits.

As illustrated in FIG. 5A or 5B, in the digital-to-analog converter 100A, as an output voltage Vout dividing between voltages VA and VB in accordance with the digital data DT, two types of specifications including any one of voltages equivalent to the voltages VA and VB can be formed.

In the following example, for the simplification of description, although a specification including an output level of a voltage value equivalent to the voltage VB as the output voltage Vout will be described, a change to a specification including an output level of a voltage value equivalent to the voltage VA as the output voltage Vout may be performed.

Embodiment 1/Example 1-1-3

Similar to FIG. 5A, FIG. 5C is a diagram illustrating yet another example of the specification of a case in which N=3 and K=2 in the digital-to-analog converter 100A illustrated in FIG. 3. In addition, similar to FIG. 5A, FIG. 5C represents a relation among a combination of two voltages (VA and VB) for input voltages V<1> to V<4>, settings of tail current ratios m<1> to m<4> of differential pairs, and an output voltage (output level) Vout based on the digital data DT of three bits.

Similar to FIG. 5A, FIG. 5C illustrates a specification at the time of outputting output levels 1 to 8 among output levels 0 to 8 dividing between the voltages VA and VB (levels 0 and 8) into 8 parts in accordance with the digital data DT of three bits. In addition, FIG. 5C is a specification in which input voltages V<2> and V<3> are configured to be common. By configuring the input voltages V<2> and V<3> to be common, the number of elements of the decoder 50A_1 distributing the voltages (VA and VB) as input voltages V<1> to V<4> can be reduced.

In FIG. 5C, a differential pair (one of two differential pairs) to which only the voltage VB (the level 8) is input with output levels 1 to 7, so-called receiving the input voltage V<1> is similar to that illustrated in FIG. 5A, and a tail current ratio m<1> thereof is switched to three values (0.5:1:1.5) in accordance with a code value of lower two bits (D1 and D0) of the digital data DT. On the other hand, differently from FIG. 5A, in the specification of FIG. 5C, there is no differential pair to which only the voltage VA (the level 0) is input with the output levels 1 to 7. For this reason, the other differential pair (the other of the predetermined two differential pairs) of which a tail current ratio is controlled to be switched is switched, for example, in accordance with a code value of D2 that is a higher bit of the digital data DT. More specifically, switching control of a tail current ratio is performed for a differential pair to which an input voltage V<3>, to which the voltage VA (the level 0) is set, is input in accordance with a code value 0 of the digital data D2 and a differential pair to which an input voltage V<4>, to which the voltage VA (the level 0) is set, is input in accordance with a code value 1 of D2. In other words, in a case in which the digital data D2 represents the code value of 0, the tail current ratio m<3> of the differential pair to which the input voltage V<3> is input is controlled to be three values (0.5:1:1.5) in accordance with the lower two bits (D1 and D0) of the digital data DT, and in a case in which the digital data D2 represents the code value of 1, the tail current ratio m<4> of the differential pair to which the input voltage V<4> is input is controlled to be three values (0.5:1:1.5) in accordance with the lower two bits (D1 and D0) of the digital data DT.

In accordance with this, an operation similar to that illustrated in FIG. 5A can be realized. In addition, the differential pair of which the tail current ratio is controlled when the code value of the digital data D2 is 0 may be a differential pair to which the input voltage V<2> is input in place of the differential pair to which the input voltage V<3> is input. Furthermore, as long as the differential pair is a differential pair to which the voltage VA (the level 0) is input, switching of a tail current ratio may be performed using a method other than the switching according to the code value of D2 described above. In short, two differential pairs that are targets for switching control of a tail current ratio may exchange tail current ratios thereof in a case in which input voltages are the same.

As above, in the specifications illustrated in FIGS. 5A to 5C, when an output level 0 or 8 of a voltage value that is the same as the voltage VA or VB is output as the output voltage Vout, the decoder 50A_1 supplies only one of the voltage VA (the level 0) or VB (the level 8) to input terminals of four differential pairs receiving input voltages V<1> to V<4> on the basis of the digital data DT of three bits. In addition, when output levels 1 to 7 between voltages VA and VB except for voltage values that are the same as the voltages VA and VB are output as the output voltage Vout, the decoder 50A_1 distributes and supplies the voltage VA (the level 0) and VB (the level 8) to input terminals of four differential pairs receiving input voltage V<1> to V<4> on the basis of digital data DT of three bits. In addition, two differential pairs that are targets for switching control of a tail current ratio are a differential pair to which the voltage VA (level 0) is input for the output levels 1 to 7 and a differential pair to which the voltage VB (level 8) is input for the output levels 1 to 7. A current ratio between tail currents supplied to these two differential pairs is controlled to be three values (0.5:1:1.5) in accordance with lower two bits (D1, D0) of the digital data DT, and, for the output levels 1 to 7, the tail current ratio is set to 0.5 or 1.5 at the time of an odd-numbered output level from the output levels 0 and 8 that are the same as the voltage VA or VB, and the tail current ratio is set to 1 at the time of an even-numbered output level. In addition, the tail current ratio is set to 1 at the time of an output level of 0 or 8 that is the same as the voltage VA or VB. Furthermore, tail current ratios of differential pairs other than the targets for switching control of a tail current ratio are set to one value (a current ratio of 1) regardless of the digital data DT.

In addition, regarding two differential pairs that are targets for switching control of tail current ratios, switching to a differential pair to which the voltage VA (the level 0) is input for output levels 1 to 7 may be performed in accordance with a part of bits (for example, D2) of the digital data DT. Similarly, switching to a differential pair to which the voltage VB (level 8) is input for output levels 1 to 7 may be performed in accordance with a part of bits of the digital data DT.

Embodiment 1/Example 1-1-4

FIG. 5D is a diagram illustrating another example of the specification of a case in which N=3 and K=2 in the digital-to-analog converter 100A illustrated in FIG. 3.

Similar to the specification of FIG. 5A, FIG. 5D is an example of a specification representing a relation among a combination of voltages (VA and VB) for input voltages V<1> to V<4>, settings of tail current ratios m<1> to m<4> of differential pairs, and an output voltage (output level) Vout.

FIG. 5D is a specification in which tail current ratios of all the four differential pairs are switched in accordance with digital data DT in the specification of FIG. 5A. Similar to FIG. 5A, FIG. 5D is a specification in which levels 1 to 8 among levels 0 to 8 dividing between voltages VA and VB (the levels 0 and 8) into 8 parts are associated with digital data DT of three bits. In FIG. 5D, also input voltage V<1> to V<4> of four differential pairs are the same as those of FIG. 5A, and only control of a tail current ratio is different.

FIG. 5D is a specification in which the settings of both the tail current ratios m<2> and m<3> are changed from ratios of 1 to ratios of 0.5 and 1.5 in the specification of FIG. 5A such that levels 1, 3, 5, and 7 of odd-numbered output voltages Vout are acquired. However, in this change, the input voltages V<2> and V<3> of differential pairs are the same, and thus, for a combination of three values (0.5:1:1.5) of which an average of the tail current ratios is 1, as is apparent from Equation (10) represented above, the output voltage Vout does not change.

Thus, although there may be at least two differential pairs of which tail current ratios are controlled to be switched to three values, in addition to predetermined two differential pairs, in predetermined digital data, as long as there is no change in an average value or a total value of tail current ratios between differential pairs of which input voltages are the same, the differential pairs may be controlled to have different current ratios. In other words, tail currents of all the four differential pairs may be controlled to be switched. In FIG. 5D, the tail current ratios m<1> and m<2> are set to the same switching control, and the tail current ratios m<3> and m<4> are set to the same switching control. Here, generally, the less the number of differential pairs of which tail current ratios are controlled, the simpler the tail current control circuit 13A, and thus area reduction is further achieved.

In addition, as described above, in performing variation control of tail current ratios of current sources 13_1 to 13_4 on the basis of a predetermined bit of digital data DT with the number of differential pairs set to four, a combination pattern of three values (0.5:1:1.5) of the tail current ratios thereof is not limited to those illustrated in the specifications of FIGS. 5A to 5D.

Embodiment 1/Example 1-1-5

Figure 6A:
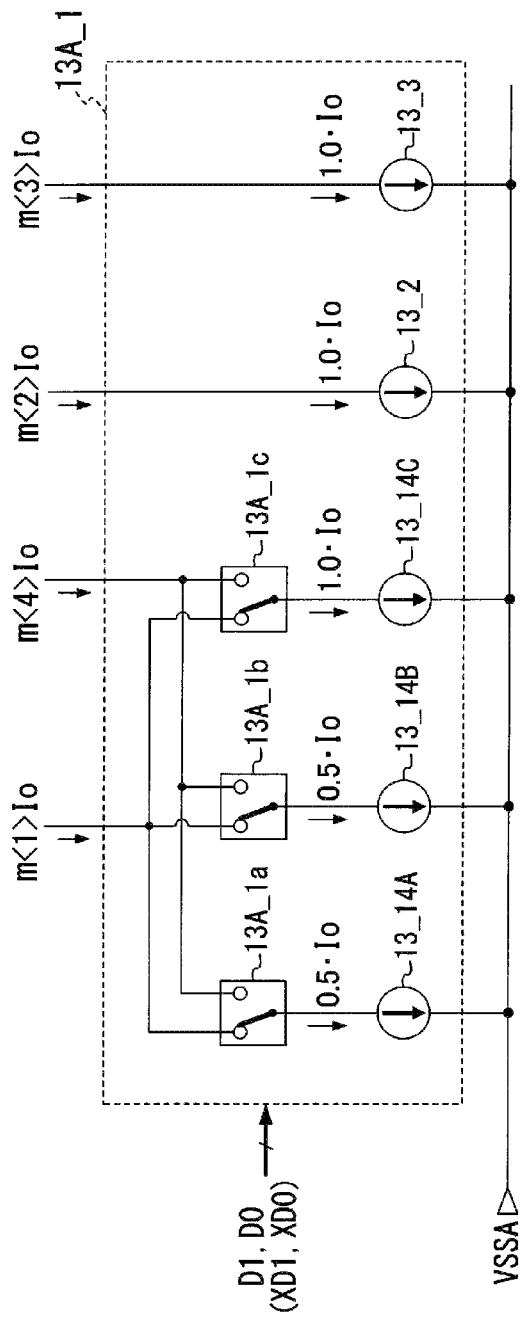
FIG. 6A is a circuit diagram illustrating the configuration of a tail current control circuit 13A_1 corresponding to the specification of FIGS. 5A and 5B.

FIG. 6A is a circuit diagram illustrating the configuration of a tail current control circuit 13A_1 corresponding to the specification (N=3, K=2) of FIGS. 5A and 5B as another example of the tail current control circuit 13A included in the digital-to-analog converter 100A illustrated in FIG. 3.

The tail current control circuit 13A_1 illustrated in FIG. 6A employs constant current sources 13_14A and 13_14B of which a current ratio is 0.5 and constant current source 13_14C of which a current ratio is 1 in place of the variable current sources 13_1 and 13_4 illustrated in FIG. 3 in which N=3 and K=2. In addition, the tail current control circuit 13A_1 includes constant current sources 13_2 and 13_3 of which a current ratio is fixed to 1 and switches 13A_1a, 13A_1b, and 13A_1c controlled in accordance with lower 2 bits (D1 and D0) of digital data DT and complementary signals (XD1 and XD0) thereof. Here, a tail current ratio represents a current ratio of a tail current supplied to each differential pair of the differential amplifier 10A illustrated in FIG. 3 to a reference current value Io.

In such a configuration, the tail current control circuit 13A_1 can perform switching control of tail current ratios m<1> and m<4> using three values (0.5:1:1.5) in accordance with lower two bits (D1 and D0) of the digital data DT. In addition, the tail current ratios m<2> and m<3> are fixed to a current ratio of 1 regardless of the digital data.

Although FIG. 6A is an example in which five constant current sources are configured, in place of three constant current sources 13_14A, 13_14B, and 13_14C among them, for example, switches corresponding to two constant current sources of which a current ratio is 0.5 and two constant current sources of which a current ratio is 1 can be configured.

In addition, by applying the same configuration as the switching control of tail current ratios of m<1> and m<4> also to m<2> and m<3>, it can respond to the specification of FIG. 5D.

Embodiment 1/Example 1-1-6

Figure 6B:
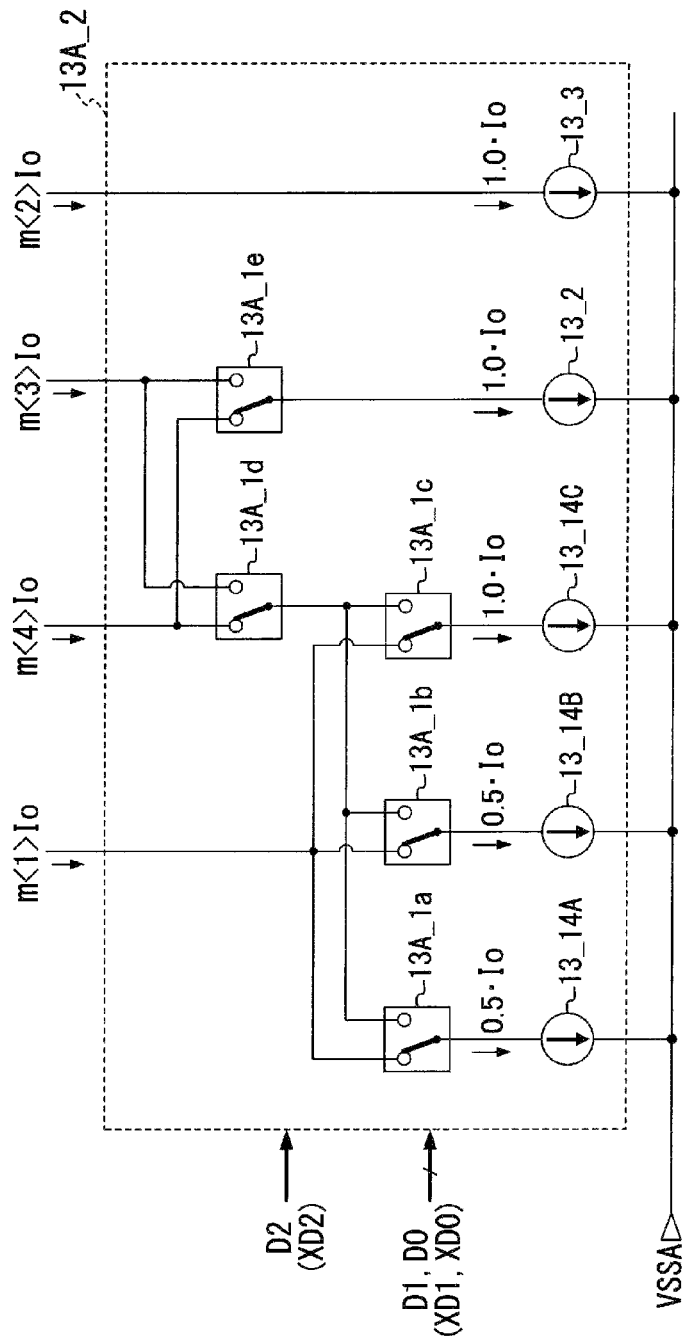
FIG. 6B is a circuit diagram illustrating the configuration of a tail current control circuit 13A_2 corresponding to the specification of FIG. 5C.

FIG. 6B is a circuit diagram illustrating the configuration of a tail current control circuit 13A_2 corresponding to the specification (N=3 and K=2) of FIG. 5C as another example of the tail current control circuit 13A included in the digital-to-analog converter 100A illustrated in FIG. 3.

The tail current control circuit 13A_2 is acquired by further adding switches 13A_1d and 13A_1e controlled using one bit (D2) of the digital data DT and a complementary signal (XD2) thereof to the tail current control circuit 13A_1 illustrated in FIG. 6A. In accordance with this, the tail current ratios m<3> and m<4> are changed in accordance with a code value of D2, and when one of the tail current ratios m<3> and m<4> is variably controlled to be three values (0.5:1:1.5), the other tail current ratio is controlled to be a fixed value of 1. The tail current ratios m<1> and m<2> are formed to have the same configuration as that illustrated in FIG. 6A. In addition, similar to FIG. 6A, a change for a configuration in which constant current sources and switches are increased can be performed.

Embodiment 1/Example 1-2-1

FIG. 7A is another example of a specification of a case in which N=4 and K=3 are set in the digital-to-analog converter 100A illustrated in FIG. 3. In accordance with this, the decoder 50A_1 illustrated in FIG. 3 selects a combination for distributing voltages (VA, VB) to 8 terminals on the basis of digital data of four bits. A differential amplifier 10A has 8 (K=3) differential pairs connected in parallel, non-inverting input terminals thereof are connected to 8 terminals, and a combination of voltages (VA, VB) selected by a decoder 50A_1 is input as input voltages V<1> to V<8>.

The tail current control circuit 13A controls two tail current ratios m<1> and m<8> among tail current ratios m<1> to m<8> of tail currents supplied to 8 differential pairs (11_1, 12_1) to (11_8, 12_8) to be three values (0.5:1:1.5) in accordance with lower two bits (D1, D0) of the digital data DT and controls the tail current ratios m<2> to m<7> to be a fixed value of 1. In accordance with the configuration described above, an output voltage Vout acquired in a case in which K=3 is set in Equation (10) represented above is output.

In addition, FIG. 7A illustrates a specification at the time of outputting a total of 16 levels (output levels 1 to 16) including levels 1 to 15 and one of voltages VA and VB (levels 0 and 16) among levels 0 to 16 dividing between two voltages (levels 0 and 16) into 16 parts in accordance with digital data DT of four bits. Although FIG. 7A illustrates the specification at the time of outputting the output levels 1 to 16 in accordance with digital data DT of four bits, it can handle a specification for outputting output levels 0 to 15 in accordance with digital data DT of four bits. Hereinafter, a further detailed operation in an example of the specification for outputting output levels 1 to 16 in accordance with digital data DT of four bits will be described.

In FIG. 7A, for the digital data DT of four bits, input voltages V<1> to V<8> of the differential amplifier 10A represent specifications different from each other. In other words, for output levels 1 to 15 between two voltages (VA and VB) (levels 0 and 16), the input voltage V<1> is set only to the voltage VB (level 16), and the input voltage V<8> is set only to the voltage VA (level 0). For output level 16, all the input voltages V<1> to V<8> are set to level 16 (the voltage VB). In addition, two differential pairs of which tail current ratios are controlled to be switched include one differential pair to which only the voltage VA (level 0) is input (receiving V<8>) in output levels 1 to 15 and one differential pair to which only the voltage VB (level 16) is input (receiving V<1>), and tail current ratios m<1> and m<8> of the two differential pairs receiving V<1> and V<8> are switched to three values (0.5:1:1.5) in accordance with the digital data. In addition, in the switching control of three values of tail current ratios, for output levels 1 to 15, a tail current ratio of 0.5 or 1.5 is set at the time of an odd numbered output level from an output level (level 0 or 16) that is the same as the voltage VA or VB, and a tail current ratio of 1 is set at the time of an even numbered output level.

At this time, one value (a ratio of 1) is assigned to tail current ratios m<2> to m<7> of differential pairs receiving input voltages V<2> to V<7> regardless of digital data DT, and the voltage VA (level 0) or the voltage VB (level 8) satisfying Equation (10) for output levels 1 to 15 is input to the input voltages V<2> to V<7>.

In addition, for each of output levels (levels 0 and 16) that is the same as the voltage VA or VB, only one of the voltage VA or VB is input to the input voltages V<1> to V<8>, and thus one value (a ratio of 1) is assigned to the tail current ratio of each differential pair.

The tail current control circuit 13A in the specification of FIG. 7A can be easily configured, for example, as illustrated in FIG. 6A, by applying a circuit relating to tail current ratios m<1> and m<4> based on a code value of the digital data (D1, D0) to a circuit relating to tail current ratios m<1> and m<8> or the like.

As above, in the specification of FIG. 7A, the digital-to-analog converter 100A including the differential amplifier 10A that has 8 differential pairs and performs switching control of predetermined two tail current ratios to three values using the tail current control circuit 13A amplifies and outputs an output voltage Vout of 16 levels among output levels dividing between the voltages VA and VB into 16 parts on the basis of digital data DT of four bits.

Embodiment 1/Example 1-2-2

FIG. 7B is yet another example of a specification of a case in which N=4 and K=3 are set in the digital-to-analog converter 100A illustrated in FIG. 3. In the specification illustrated in FIG. 7B, a combination of voltages (VA and VB) selected by the decoder 50A_1 illustrated in FIG. 3 is different from that illustrated in FIG. 7A, and, among input voltages V<1> to V<8> for 8 differential pairs, V<3> and V<4> are commonly set, V<5> and V<6> are commonly set, and V<7> and V<8> are commonly set. In addition, by configuring input voltages to be common, the number of elements of the decoder 50A_1 distributing the voltages (VA and VB) as input voltages V<1> to V<8> can be reduced.

Similar to FIG. 7A, FIG. 7B illustrates a specification at the time of outputting levels 1 to 16 among levels 0 to 16 dividing between voltages VA and VB (levels 0 and 16) into 16 parts in accordance with digital data DT of four bits.

In FIG. 7B, one of two differential pairs of which tail current ratios are controlled to be switched is, similar to FIG. 7A, a differential pair to which only the voltage VB (level 16) is input (receiving V<1>) for output levels 1 to 15, and a tail current ratio of the differential pair is switched to three values (0.5:1:1.5) in accordance with the digital data (D1, D0). On the other hand, in the other of the two differential pairs of which tail current ratios are controlled to be switched, different from FIG. 7A, there is no differential pair to which only the voltage VA (level 0) is input for output levels 1 to 15. For this reason, the other of the two differential pairs of which tail current ratios are controlled to be switched is switched to a differential pair to which the voltage VA (level 0) is input in accordance with a code value of the digital data (D3, D2). More specifically, for example, for a differential pair to which a voltage V<8> to which the voltage VA (level 0) is set on the basis of a code value (0, 0), (0, 1), or (1, 0) of the digital data (D3, D2) is input and a differential pair to which a voltage V<2> to which the voltage VA (level 0) is set on the basis of a code value (1, 1) of the digital data (D3, D2) is input, switching control of tail current ratios is performed.

In accordance with this, operations similar to the operations of FIG. 7A can be realized also in FIG. 7B. In addition, in a code value (0,0), (0,1), or (1,0) of the digital data (D3, D2), a differential pair to which the voltage V<7> in place of the voltage V<8> is input may be used. Furthermore, differential pairs that are targets for switching tail current ratios may be switched using a method other than switching control based on a code value of the digital data (D3, D2) described above. In this way, two differential pairs that are targets for switching control of tail current ratios may be interchanged on the basis of digital data in a case in which input voltages are the same.

In addition, similar to the specification change for FIGS. 5A and 5B or FIG. 5D, a specification change for FIGS. 7A and 7B can be performed.

In other words, in the specifications illustrated in FIGS. 7A and 7B, when an output level 0 or 16 of a voltage value that is the same as the voltage VA or VB is output as an output voltage Vout, the decoder 50A_1 supplies only one of the voltage VA (level 0) or VB (level 16) to input terminals of 8 differential pairs receiving input voltages V<1> to V<8> on the basis of digital data DT of four bits. In addition, when one of output levels 1 to 15 between the voltages VA and VB except for the voltage values that are the same as the voltages VA and VB are output as the output voltage Vout, the decoder 50A_1 distributes and supplies the voltages VA (level 0) and VB (level 16) to input terminals of 8 differential pairs receiving input voltages V<1> to V<8> on the basis of digital data DT of four bits. In addition, two differential pairs that are targets for switching control of a tail current ratio are a differential pair to which the voltage VA (level 0) is input for the output levels 1 to 15 and a differential pair to which the voltage VB (level 8) is input for the output levels 1 to 15. A tail current ratio between tail currents supplied to these two differential pairs is variably controlled to be three values (0.5:1:1.5) in accordance with lower two bits (D1, D0) of the digital data DT, and, for the output levels 1 to 15, the tail current ratio is set to 0.5 or 1.5 at the time of an odd-numbered output level from the output levels 0 and 16 that are the same as the voltage VA or VB, and the tail current ratio is set to 1 at the time of an even-numbered output level. In addition, the tail current ratio is set to 1 at the time of an output level of 0 or 16 that is the same as the voltage VA or VB. Furthermore, tail current ratios of differential pairs other than the targets for switching control of a tail current ratio are set to one value (a current ratio of 1) regardless of the digital data DT.

In addition, regarding two differential pairs that are targets for switching control of tail current ratios, switching to a differential pair to which the voltage VA (the level 0) is input for output levels 1 to 15 may be performed in accordance with a part of bits of the digital data DT. Similarly, switching to a differential pair to which the voltage VB (level 16) is input for output levels 1 to 15 may be performed in accordance with a part of bits of the digital data DT.

In addition, although there may be at least two differential pairs of which tail current ratios are controlled to be switched to three values, in addition to predetermined two differential pairs, in predetermined digital data, as long as there is no change in an average value or a total value of tail current ratios between differential pairs of which input voltages are the same, the differential pairs may be controlled to have different current ratios.

The tail current control circuit in the specification of FIG. 7B can be easily configured, as illustrated in FIG. 6B, by applying a circuit relating to tail current ratios m<3> and m<4> based on a code value of the digital data D2 to a circuit corresponding to the tail current ratios m<2> and m<8> based on a code value of the digital data (D3, D2) or the like.

Embodiment 2/Example 2-1-1

FIG. 8 is a diagram illustrating an example of a specification of a case in which N=3 and K=1 in the digital-to-analog converter 100A illustrated in FIG. 3. In accordance with this, the decoder 50A_1 illustrated FIG. 3 selects a combination for distributing voltages (VA and VB) into two terminals on the basis of digital data DT of 3 bits. A differential amplifier 10A has two (K=1) differential pairs connected in parallel, non-inverting input terminals thereof are connected to two terminals, and a combination of voltages (VA and VB) selected by the decoder 50A_1 is input as input voltages V<1> and V<2>. The tail current control circuit 13A performs control of tail current ratios m<1> and m<2> of tail currents supplied to two differential pairs (11_1, 12_1) to (11_2, 12_2) to be seven values of (0.25:0.5:0.75:1:1.25:1.5:1.75) in accordance with lower three bits (D2 to D0) of the digital data DT. In accordance with the configuration described above, an output voltage Vout acquired in a case in which K=1 in Equation (10) represented above is output.

In addition, FIG. 8 illustrates a specification at the time of outputting a total of 8 levels (output levels 1 to 8) including levels 1 to 7 and one of voltages VA and VB among levels 0 to 8 dividing between the voltages VA and VB (levels 0 and 8) into 8 parts in accordance with digital data DT of three bits. Although FIG. 8 illustrates the specification at the time of outputting the output levels 1 to 8 in accordance with digital data DT of three bits, it can handle a specification for outputting output levels 0 to 7 in accordance with digital data DT of three bits. Hereinafter, a further detailed operation in an example of the specification for outputting output levels 1 to 8 in accordance with digital data DT of three bits will be described.

In FIG. 8, for the digital data DT of three bits, input voltages V<1> and V<2> of the differential amplifier 10A represent specifications different from each other. In other words, for output levels 1 to 7 between the voltages VA and VB (levels 0 and 8), V<1> is set only to the voltage VB (level 8), and V<2> is set only to the voltage VA (level 0). For output level 8, both V<1> and V<2> are set to level 8 (the voltage VB). In addition, switching control of tail current ratios is performed for each of two differential pairs, and the tail current ratios are switched to seven values (0.25:0.5:0.75:1:1.25:1.5:1.75) in accordance with digital data. The seven values may be the same as 1:2:3:4:5:6:7 as a ratio. For the convenience of description, in FIG. 8, ratios of which an average is 1 are represented. In addition, in switching control of 7 values of tail current ratios m<1> and m<2> of two differential pairs, tail current ratios are respectively set to 0.25 and 1.75 at the time of output levels adjacent from output levels (levels 0 and 8) that are the same as the voltage VA or VB among output levels 1 to 7, the tail current ratios are respectively set to 0.5 and 1.5 at the time of output levels that are second adjacent thereto, the tail current ratios are respectively set to 0.75 and 1.25 at the time of output levels that are third adjacent thereto, and both the tail current ratios are set to 1 at the time of output levels that are fourth adjacent thereto. In addition, for each of output levels (levels 0 and 8) that is the same as the voltage VA or VB, only one of the voltage VA or VB is input to the input voltages V<1> and V<2>, and thus one value (a ratio of 1) is assigned to the tail current ratio of each differential pair.

As above, in the specification of FIG. 8, the digital-to-analog converter 100A including the differential amplifier 10A that has 2 differential pairs and performs switching control of predetermined two tail current ratios to seven values using the tail current control circuit 13A amplifies and outputs an output voltage Vout of 8 levels among output levels dividing between the voltages VA and VB into 8 parts on the basis of digital data DT of three bits.

Embodiment 2/Example 2-1-2

Figure 9:
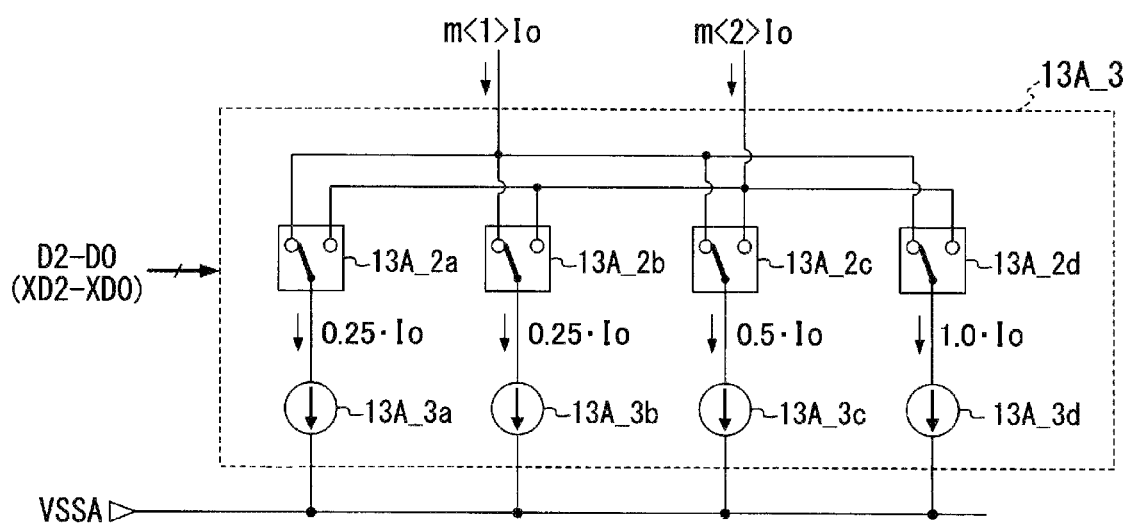
FIG. 9 is a circuit diagram illustrating the configuration of a tail current control circuit 13A_3 corresponding to the specification of FIG. 8.

FIG. 9 is a circuit diagram illustrating the configuration of a tail current control circuit 13A_3 corresponding to the specification of FIG. 8 as the tail current control circuit 13A included in the digital-to-analog converter 100A illustrated in FIG. 3.

In the tail current control circuit 13A_3, the two variable current sources 13_1 and 13_2 illustrated in FIG. 3 in which N=3 and K=1 are configured using four constant current sources formed from constant current sources 13A_3a and 13A_3b having a current ratio of 0.25, a constant current source 13A_3c having a current ratio of 0.5, and a constant current source 13A_3d having a current ratio of 1 and switches 13A_2a to 13A_2d. The switches 13A_2a to 13A_2d are respectively disposed in correspondence with the constant current sources 13A_3a to 13A_3d and generate two tail currents supplied to two differential pairs on the basis of digital data of three bits (D2 to D0) and complementary signals thereof (XD2 to XD0).

In other words, by synthesizing currents of the four constant current sources described above in a form based on the digital data (D2 to D0), the tail current control circuit 13A_3 performs switching control of the tail current ratios m<1> and m<2> of the tail currents supplied to the two differential pairs to seven values (0.25:0.5:0.75:1:1.25:1.5:1.75).

Although FIG. 9 illustrates an example in which four constant current sources and four switches that are minimums are configured, the number of constant current sources and the number of switches are not limited to four and may be five or more.

Embodiment 2/Example 2-2-1

FIG. 10A is a diagram illustrating an example of a specification of a case in which N=4 and K=2 in the digital-to-analog converter 100A illustrated in FIG. 3. In accordance with this, the decoder 50A_1 illustrated FIG. 3 selects a combination for distributing voltages (VA and VB) into four terminals on the basis of digital data DT of 4 bits. A differential amplifier 10A has four (K=2) differential pairs connected in parallel, non-inverting input terminals thereof are connected to four terminals, and a combination of voltages (VA and VB) selected by the decoder 50A_1 is input as input voltages V<1> to V<4>. The tail current control circuit 13A performs control of tail current ratios m<1> and m<4> among tail current ratios m<1> to m<4> of tail currents supplied to four differential pairs (11_1, 12_1) to (11_4, 12_4) to be seven values of (0.25:0.5:0.75:1:1.25: 1.5:1.75) in accordance with lower three bits (D2 to D0) of the digital data DT. In addition, the tail current control circuit 13A performs control of the tail current ratios m<2> and m<3> to be a fixed value of 1. In accordance with the configuration described above, an output voltage Vout acquired in a case in which K=2 in Equation (10) represented above is output.

In addition, FIG. 10A illustrates a specification at the time of outputting a total of 16 levels including levels 1 to 15 and one of voltages VA and VB among levels 0 to 16 dividing between the voltages VA and VB (levels 0 and 16) into 16 parts in accordance with digital data DT of four bits. Although FIG. 10A illustrates the specification at the time of outputting the output levels 1 to 16 in accordance with digital data DT of four bits, it can handle a specification for outputting output levels 0 to 15 in accordance with digital data DT of four bits. Hereinafter, a further detailed operation in an example of the specification for outputting output levels 1 to 16 in accordance with digital data DT of four bits will be described.

In FIG. 10A, for the digital data DT of four bits, input voltages V<1> to V<4> of the differential amplifier 10A represent specifications different from each other. In other words, for output levels 1 to 15 between voltages VA and VB (levels 0 and 16), V<1> is set only to the voltage VB (level 16), and V<4> is set only to the voltage VA (level 0). For output level 16, all V<1> to V<4> are set to the voltage VB (level 16). In addition, two differential pairs of which tail current ratios are controlled to be switched include one differential pair to which only the voltage VA (level 0) is input (receiving V<4>) in output levels 1 to 15 and one differential pair to which only the voltage VB (level 16) is input (receiving V<1>), and tail current ratios m<1> and m<4> of the two differential pairs receiving V<1> and V<4> are switched to seven values of (0.25:0.5:0.75:1:1.25:1.5: 1.75) in accordance with the digital data. In addition, in switching control of 7 values of tail current ratios m<1> and m<4> of two differential pairs, tail current ratios are respectively set to 0.25 and 1.75 at the time of output levels adjacent from output levels (levels 0 and 16) that are the same as the voltage VA or VB among output levels 1 to 15, the tail current ratios are respectively set to 0.5 and 1.5 at the time of output levels that are second adjacent thereto, the tail current ratios are respectively set to 0.75 and 1.25 at the time of output levels that are third adjacent thereto, both the tail current ratios are set to 1 at the time of output levels that are fourth adjacent thereto, the tail current ratios are respectively set to 1.25 and 0.75 at the time of output levels that are fifth adjacent thereto, the tail current ratios are respectively set to 1.5 and 0.5 at the time of output levels that are sixth adjacent thereto, the tail current ratios are respectively set to 1.75 and 0.25 at the time of output levels that are seventh adjacent thereto, and both the tail current ratios are set to 1 at the time of output levels that are eighth adjacent thereto.

In addition, the tail current ratios m<2> and m<3> of differential pairs receiving input voltages V<2> and V<3> are set to one value (a ratio of 1) regardless of digital data.

As input voltage V<2> to V<3>, the voltage VA (level 0) and the voltage VB (level 16) satisfying Equation (10) for output levels 1 to 15 are input. The tail current ratios (m<2> and m<3>) of differential pairs receiving the input voltages V<2> to V<3> become one value (a ratio of 1) regardless of the digital data.

In addition, in the output levels (levels 0 and 16) that are the same as the voltage VA or VB, only one of the voltage VA or VB is supplied to the input voltages V<1> to V<4>, and one value (a ratio of 1) is assigned as the tail current ratio of each differential pair.

The tail current control circuit 13A of the specification of FIG. 10A can be easily configured by applying a circuit relating to the tail current ratios m<1> and m<2> according to a code value of the digital data (D2 to D0) to a circuit relating to the tail current ratios m<1> and m<4> and adding a constant current source for fixing the current ratio corresponding to m<2> and m<3> to 1 and the like in FIG. 9.

As above, in the specification of FIG. 10A, the digital-to-analog converter 100A including the differential amplifier 10A that has four differential pairs and performs switching control of predetermined four tail current ratios to seven values using the tail current control circuit 13A amplifies and outputs an output voltage Vout of 16 levels among output levels dividing between the voltages VA and VB into 16 parts on the basis of digital data of four bits.

Embodiment 2/Example 2-2-2

FIG. 10B is a diagram illustrating another example of a specification of a case in which N=4 and K=2 in the digital-to-analog converter 100A illustrated in FIG. 3. In the specification of FIG. 10B, a combination of two voltages (VA and VB) selected by the decoder 50A_1 is different from that illustrated in FIG. 10A, V<2> and V<3> among input voltages V<1> to V<4> for four differential pairs are set to be common. In addition, by configuring input voltages to be common, the number of elements of the decoder 50A_1 distributing the voltages (VA and VB) as input voltages V<1> to V<4> can be reduced. Similar to FIG. 10A, FIG. 10B is a specification in which levels 1 to 16 among levels 0 to 16 dividing between voltages VA and VB (levels 0 and 16) into 16 parts are associated with digital data of four bits.

In FIG. 10B, one of two differential pairs of which tail current ratios are controlled to be switched is, similar to FIG. 10A, a differential pair to which only the voltage VB (level 16) is input (receiving V<1>) for output levels 1 to 15, and a tail current ratio of the differential pair is switched to seven values of (0.25:0.5:0.75:1:1.25:1.5:1.75) in accordance with the digital data. On the other hand, in the other of the two differential pairs of which tail current ratios are controlled to be switched, different from FIG. 10A, there is no differential pair to which only the voltage VA (level 0) is input for output levels 1 to 15. For this reason, the other of the two differential pairs of which tail current ratios are targets for switching control of tail current ratios is switched to a differential pair to which the voltage VA (level 0) is input in accordance with a code value of the digital data D3. More specifically, for example, for a differential pair to which a voltage V<3> to which the voltage VA (level 0) is set for the code value 0 of the digital data D3 is input and a differential pair to which a voltage V<4> to which the voltage VA (level 0) is set is input for a code value 1 of D3, switching control of tail current ratios is performed.

In accordance with this, operations similar to the operations of FIG. 10A can be realized also in FIG. 10B. In addition, in the case of a code value 0 of the digital data D3, a tail current ratio of a differential pair to which the input voltage V<2> is input may be set as a target for switching control in place of the differential pair to which the input voltage V<3> is input. Furthermore, differential pairs that are targets for switching tail current ratios may be switched using a method other than switching control based on a code value of the digital data D3 described above. In this way, two differential pairs that are targets for switching control of tail current ratios may be interchanged on the basis of digital data in a case in which input voltages are the same.

In addition, similar to the specification change of FIG. 5A to FIG. 5B or FIG. 5D, a specification change of FIG. 10A to FIG. 10B can be performed.

The tail current control circuit of the specification of FIG. 10B can be realized by adding a switch circuit controlled using the digital data D3 and a complementary signal thereof to the tail current control circuit corresponding to the specification of FIG. 10A. In other words, on the basis of a code value of the digital data D3, switching control between a state in which the tail current ratio m<3> is controlled to be seven values, and m<4> is controlled to have a fixed tail current ratio (a current ratio of 1) and a state in which the tail current ratio m<4> is controlled to be seven values, and m<3> is controlled to have a fixed tail current ratio (a current ratio of 1) is performed using the switching circuit described above.

Embodiment 3/Example 3-1-1

FIG. 11 is a diagram illustrating an example of a specification of a case in which N=4 and K=2 in the digital-toanalog converter 100 illustrated in FIG. 1. In accordance with this, the decoder 50_1 illustrated FIG. 1 selects a combination for distributing voltages (VA and VB) to four terminals on the basis of digital data DT of four bits. A differential amplifier 10 has four (K=2) differential pairs connected in parallel, non-inverting input terminals thereof are connected to four terminals, and a combination of voltages (VA and VB) selected by the decoder 501 is input as input voltages V<1> to V<4>. The tail current control circuit 13 performs control of tail current ratios m<1> to m<4> of tail currents supplied to four differential pairs to be four values of (0.25:0.75:1.25:1.75) in accordance with lower four bits (D3 to D0) of the digital data DT. In accordance with the configuration described above, an output voltage Vout acquired in a case in which K=2 in Equation (10) represented above is output.

The tail current control circuit 13 illustrated in FIG. 1 corresponding to the specification of FIG. 11 receives digital data DT of four bits and performs control of tail current ratios m<1> to m<4> of four differential pairs to four values.

Although FIG. 11 illustrates a specification at the time of outputting a total of 16 levels (output levels 1 to 16) including a voltage VB (level 16) among levels 0 to 16 dividing between two voltages VA and VB (levels 0 and 16) into 16 parts in accordance with digital data DT of four bits, it can also handle a specification outputting a total of 16 levels (output levels 0 to 15) including the voltage VA (level 0) in accordance with digital data DT of four bits. In addition, the four values described above may be 1:3:5:7 as a ratio. For the convenience of description, in FIG. 11, ratios of which an average becomes 1 is represented.

However, the specification illustrated in FIG. 11 is different from the other specifications described above and is not realized by only performing switching control of tail current ratios of predetermined two differential pairs and requires switching control of tail current ratios of four differential pairs.

In this way, according to the digital-to-analog converter 100 according to the specification illustrated in FIG. 11, by performing switching control of tail current ratios of four differential pairs to be four values using the tail current control circuit 13, output voltages Vout of 16 levels can be amplified and output among output levels dividing between the voltages VA and VB into 16 parts.

Embodiment 3/Example 3-1-2

Figure 12:
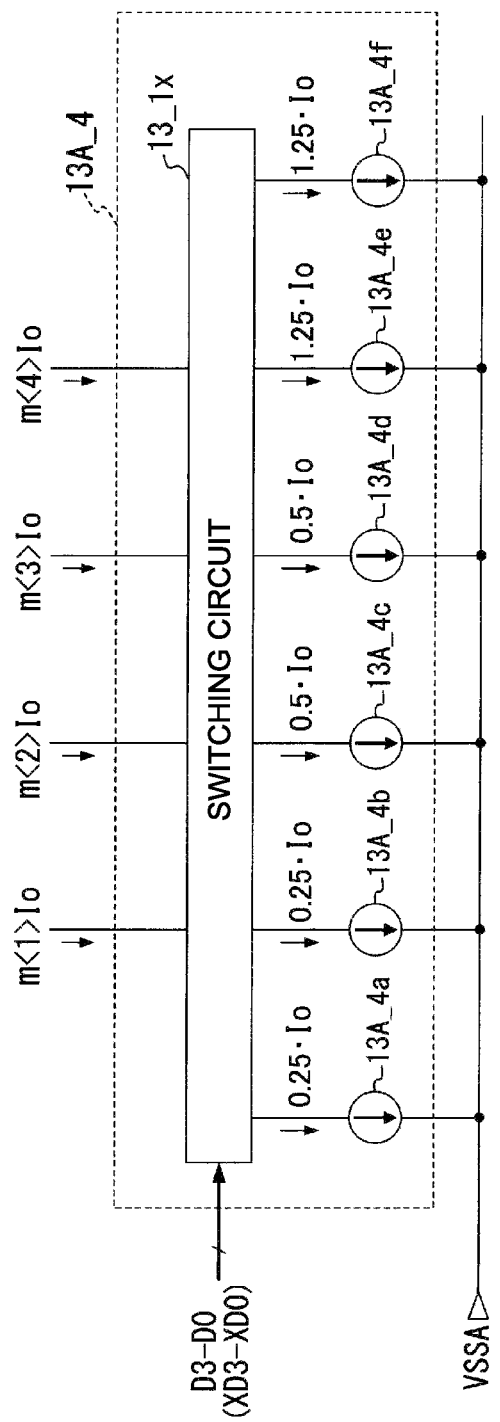
FIG. 12 is a circuit diagram illustrating the configuration of a tail current control circuit 13A_4 corresponding to the specification of FIG. 11.

FIG. 12 is a circuit diagram illustrating the configuration of a tail current control circuit 13A_4 corresponding to the specification of FIG. 11 as the tail current control circuit 13 included in the digital-to-analog converter 100 illustrated in FIG. 1.

The tail current control circuit 13A_4 includes constant current sources 13A_4a and 13A_4b having a current ratio of 0.25, constant current source 13A_4c and 13A_4d having a current ratio of 0.5, constant current sources 13A_4e and 13A_4f having a current ratio of 1.25, and a switching circuit 13_1x. The switching circuit 13_1x synthesizes currents of the four differential pairs and the constant current sources 13A_4a to 13A_4f on the basis of digital data D3 to D0 of four bits and complementary signals XD3 to XD0 thereof and generates four tail currents to be supplied to the four differential pairs. In other words, by using the switching circuit 13_1x, tail current ratios m<1> to m<4> of the four differential pairs are controlled to be switched to four values (0.25:0.75:1.25:1.75) in accordance with the specification of FIG. 11.

Embodiment 4

Figure 13:
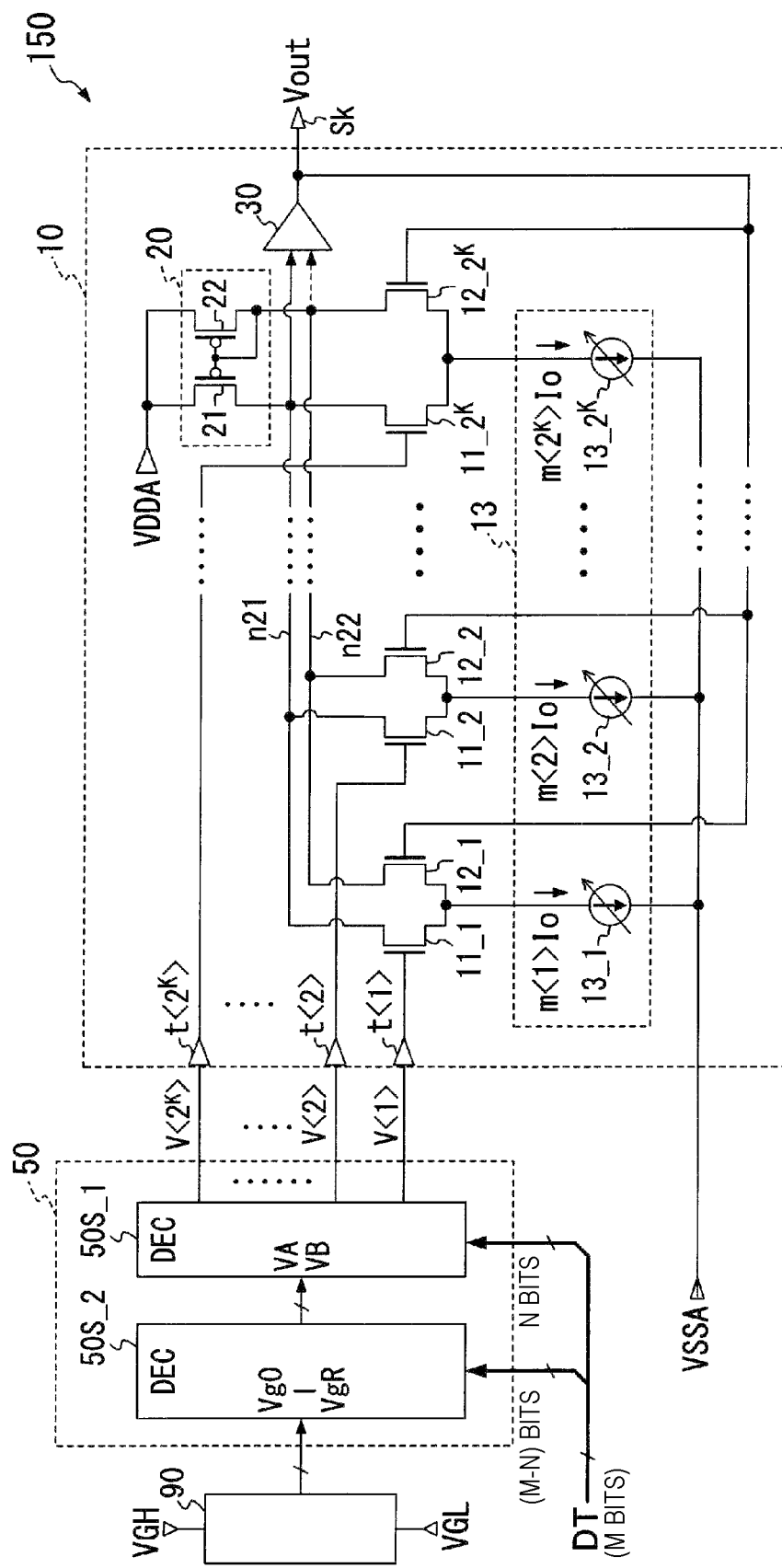
FIG. 13 is a circuit diagram illustrating the configuration of a digital-to-analog converter 150 representing a modified example of the digital-to-analog converter 100.

FIG. 13 is a circuit diagram illustrating the configuration of a digital-to-analog converter 150 representing a modified example of the digital-to-analog converter 100 illustrated in FIG. 1.

The digital-to-analog converter 150 is a digital-to-analog converter having digital data DT of M (here, M is an integer equal to or greater than four) bits, which is more than the number N of bits of digital data DT that can be handled by the digital-to-analog converter 100 as a conversion target.

The digital-to-analog converter 150 includes a reference voltage generating part 90, a decoder 50, and a differential amplifier 10.

The reference voltage generating part 90 receives a DC reference power supply voltage VGH and a reference power supply voltage VGL that is lower than the reference power supply voltage VGH. The reference voltage generating part 90 generates reference voltages Vg0 to VgR (here, R is an integer equal to or greater than 2) of which voltage values are different from each other on the basis of the reference power supply voltages VGH and VGL and supplies such reference voltages Vg0 to VgR to the decoder 50.

The decoder 50 includes sub-decoders 50S_1 and 50S_2.

The sub-decoder 50S_2 receives digital data DT of M bits and the reference voltages Vg0 to VgR and selects one pair of voltages adjacent to each other from among the reference voltages Vg0 to VgR as two voltages (VA and VB) on the basis of higher bits, for example, higher (M-N) bits of the digital data of the M bits. The sub-decoder 50S_2 supplies the selected two voltages (VA and VB) to the sub-decoder 50S_1.

The sub-decoder 50S_1 selects a combination for distributing the voltages (VA and VB) to $2^K$ terminals of the differential amplifier 10, that is, input terminals t<1> to t<$2^K$> in accordance with lower N bits of the digital data of the M bits and the two voltages (VA and VB). The sub-decoder 50S_1 supplies a voltage group in which the voltages (VA and VB) are distributed to the input terminals t<1> to t<$2^K$> of the differential amplifier 10 as input voltages V<1> to V<$2^K$>.

The differential amplifier 10 includes $2^K$ (here, K is a positive number satisfying N≥K>0) differential pairs, of which output pairs are commonly connected, connected in parallel, and non-inverting input terminals thereof are connected to the $2^K$ input terminals t<1> to t<$2^K$>.

In addition, the sub-decoder 50S_1 and differential amplifier 10 have configurations similar to those illustrated in FIG. 1 and amplifies and outputs voltage levels acquired by dividing the voltages (VA and VB) into $2^N$ parts in accordance with the digital data of N bits.

Thus, according to the configuration illustrated in FIG. 13, by selecting the voltages (VA and VB) multiple times in accordance with higher (M−N) bits of the digital data of M bits, voltage levels that are predetermined times of $2^N$ voltage numbers can be amplified and output. In addition, the sub-decoder 50S_1 and the differential amplifier 10 illustrated in FIG. 13 can be changed to the decoder 50A_1 and the differential amplifier 10A illustrated in FIG. 3.

Thus, according to the digital-to-analog converter 150 illustrated in FIG. 13, similar to the digital-to-analog converter 100 illustrated in FIG. 1, the number of differential pairs of the differential amplifier 10 can be reduced to $2^K$ that is equal to or less than ½ of a conventional case. In addition, in accordance with such reduction of the number of differential pairs, the number of combinations of two voltages (VA and VB) selected by the decoder 50_1 is decreased, and thus the number of elements configuring the decoder 50_1 is reduced, whereby area reduction can be achieved.

Particularly, in a case in which the number of bits of digital data that is a conversion target is many, it can be an effective way for inhibiting an increase of the chip area by inhibiting a circuit scale of the digital-to-analog converter.

FIG. 14 is an example of a specification of the digital-to-analog converter 150 illustrated in FIG. 13 and is a specification at the time of outputting 8 voltage levels dividing voltages (VA and VB) with N=3 and K being set to a positive number equal to or less than 2, in other words, a specification corresponding to FIG. 5A, 5C, 5D, or FIG. 8.

According to such a specification, in the sub-decoder 50S_2, in accordance with digital data of higher (M−N) bits, by selecting voltage levels of two voltages (VA and VB) for every 8 output levels, in other words, like (0, 8), (8, 16), (16, 24), . . . , output levels 1 to 8, 9 to 16, 17 to 24, . . . can be acquired.

In other words, according to the configuration illustrated in FIG. 13, the specifications of FIGS. 5A, 5C, 5D, and 8 can be expanded to specifications capable of further level outputting of multiple values. In addition, a voltage difference between the voltages (VA and VB) may be different for each of voltages selected using higher (M−N) bits. Similarly, according to the configuration illustrated in FIG. 13, extension to a multi-value level output can be performed in other specification examples.

In short, the digital-to-analog converters (100, 100A, and 150) illustrated in Embodiments 1 to 4 described above may include a differential amplifier and a decoder described below.

In other words, the differential amplifier (10, 10A) outputs an output voltage (Vout) from an output terminal (Sk) in accordance with a calculation result based on voltages (V<1> to V<$2^K$>) received by input terminals (t<1> to t<$2^K$>) thereof. The decoder (50, 50_1, 50A-1) distributes and supplies one of a first voltage (VA) and a second voltage (VB) to each of input terminals (t<1> to t<$2^K$>) of the differential amplifier (10, 10A) on the basis of digital data (DT) of N bits (here, N is a positive number equal to or greater than 3) (FIGS. 5A to 5D, FIG. 7A, FIG. 7B, FIG. 8, FIG. 10A, FIG. 10B, and FIG. 11). In addition, the differential amplifier includes $2^K$ (here, K is a positive number satisfying N≥K) differential pairs, an amplification stage, and a tail current control circuit described below.

In other words, $2^K$ differential pairs [(11_1, 12_1) to (11_$2^K$, 12_$2^K$)] include inverting input terminals (12_1 to 12_$2^K$) to which an output voltage (Vout) is commonly input and non-inverting input terminals (11_1 to 11_$2^K$) to which one of voltages (V<1> to V<$2^K$>) received by the input terminals is input, and differential pairs thereof are driven in accordance with a tail current, and output pairs are commonly connected to each other.

The amplification stage (30) generates an output voltage (Vout) in accordance with an amplification operation based on an output signal of one or both of output pairs of $2^K$ differential pairs that are commonly connected and outputs the generated output voltage to the output terminal (Sk).

The tail current control circuit (13, 13A), on the basis of a predetermined bit of the digital data DT of N bits, supplies tail currents to $2^K$ differential pairs described above and individually controls current ratios of the tail currents with respect to a reference current value (Jo).

Next, a configuration of a case in which the digital-to-analog converter according to the present disclosure is applied to a data driver of a display device will be described.

Embodiment 5/Example 1

Figure 15:
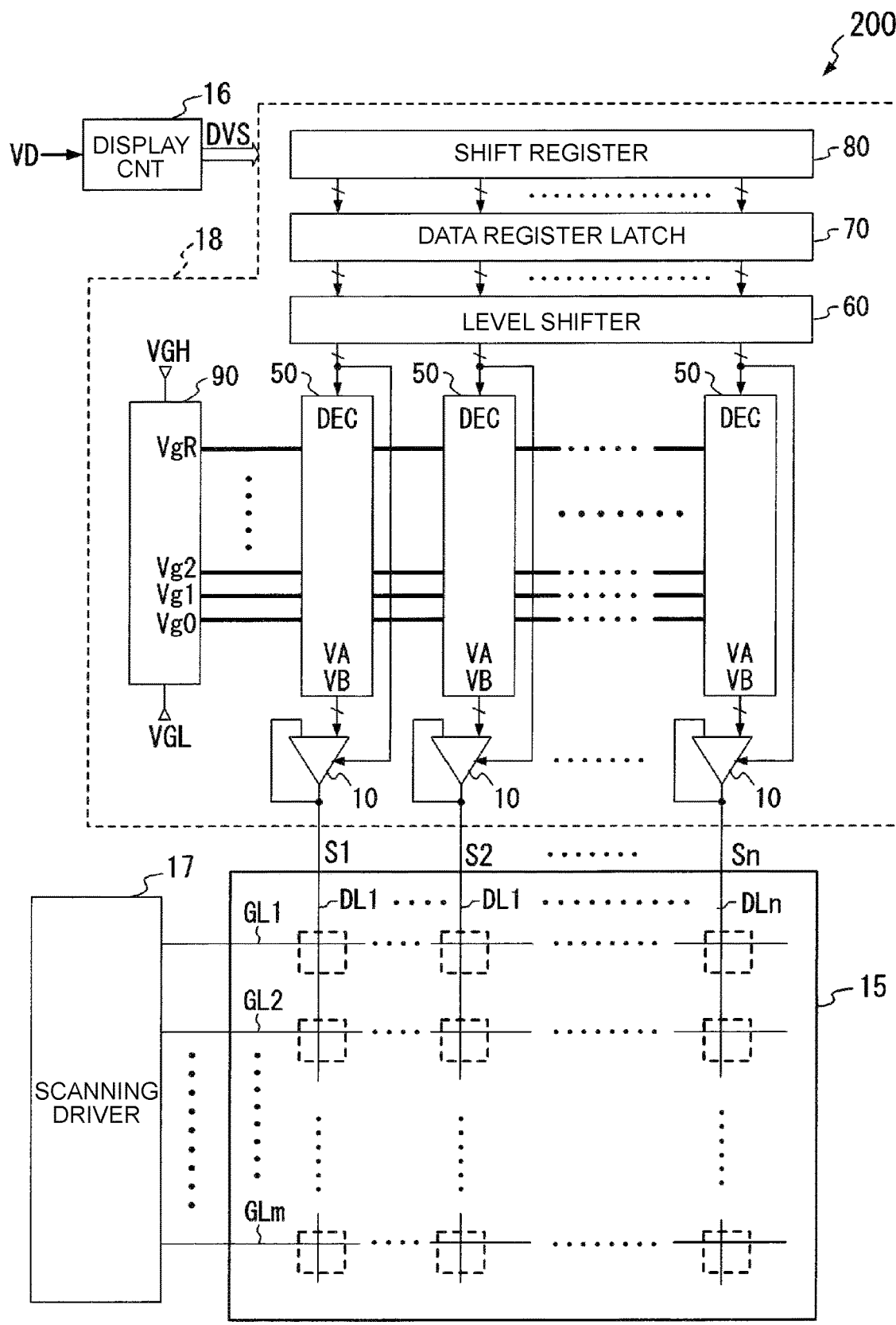
FIG. 15 is a block diagram illustrating a schematic configuration of a display device 200 including a data driver according to the present disclosure.

FIG. 15 is a block diagram illustrating a schematic configuration of a display device 200 including a data driver according to the present disclosure.

The display device 200 includes a display panel 15, a display controller 16, a scanning driver 17, and a data driver 18.

The display panel 15, for example, is formed from a liquid crystal, an organic EL display panel, or the like and includes m (here, m is a natural number equal to or greater than 2) horizontal scanning lines GL1 to GLm extending in a horizontal direction of a two-dimensional screen and n (here, n is a natural number equal to or greater than 2) data lines DL1 to DLn extending in a vertical direction of the two-dimensional screen. At each of intersections of the horizontal scanning lines and the data lines, a display cell responsible for a pixel is formed.

The display controller 16 generates a video digital signal DVS including various control signals such as a start pulse, a clock signal CLK, and vertical and horizontal synchronization signals and a series of video digital data pieces representing luminance levels of respective pixels on the basis of a video signal VD.

The display controller 16 generates a scanning timing signal synchronized with the horizontal synchronization signal described above, supplies the scanning timing signal to the scanning driver 17, and supplies the video digital signal DVS described above to the data driver 18.

The scanning driver 17 sequentially applies a horizontal scanning pulse to the horizontal scanning lines GL1 to GLm of the display panel 15 on the basis of the scanning timing signal supplied from the display controller 16.

The data driver 18 includes a shift register 80, a data register latch 70, a level shifter 60, a reference voltage generating part 90, n decoders 50, and n differential amplifiers 10.

The display controller 16 generates a video digital signal DVS including various control signals such as a start pulse, a clock signal CLK, and vertical and horizontal synchronization signals and a series of video digital data pieces representing luminance levels of respective pixels as digital values on the basis of a video signal VD and supplies this video digital signal to the data driver 18.

In accordance with a start pulse included in a video digital signal DVS, the shift register 80 generates latch timing signals for selecting a latch in synchronization with a clock signal CLK and supplies the generated latch timing signals to the data register latch 70.

The data register latch 70 takes in a predetermined number (for example, n) of video digital data pieces included in a video digital signal DVS on the basis of each latch timing signal supplied from the shift register 80 and supplies n video digital data signals representing respective video digital data pieces to the level shifter 60.

The level shifter 60 supplies n video digital data signals after level shift acquired by performing level shift processing for increasing a signal amplitude on n video digital data signals supplied from the data register latch 70 to each decoder 50.

The reference voltage generating part 90 receives a DC reference power supply voltage VGH and a reference power supply voltage VGL that is lower than the reference power supply voltage VGH. The reference voltage generating part 90 generates reference voltages Vg0 to VgR of which voltage values are different from each other on the basis of the reference power supply voltages VGH and VGL and supplies such reference voltages Vg0 to VgR to n decoders 50 disposed in correspondence with n output channels of the data driver 18.

Each decoder 50 selects one pair of reference voltages corresponding to a video digital data signal that has been shifted in level by the level shifter 60 from the reference voltage group described above. Then, each decoder 50 supplies one pair of reference voltages that have been selected to each differential amplifier 10 disposed in correspondence with n output channels of the data driver 18 as two voltages (VA and VB).

The differential amplifier 10 generates one of output voltages Vout, for example, of 16 levels dividing between voltages VA and VB that have been input and outputs a drive signal having this output voltage Vout. At this time, n drive signals output from n differential amplifiers 10 are respectively supplied to data lines DL1 to DLn of the display panel 15 as drive signals S1 to Sn.

Here, as the decoder 50, the differential amplifier 10, and the reference voltage generating part 90 disposed for each output of the data driver 18 illustrated in FIG. 15, the digital-to-analog converter 150 illustrated in FIG. 13 can be applied.

In other words, the decoder 50 illustrated in FIG. 15 selects one pair of two voltages (VA and VB) that are adjacent to each other among the reference voltages Vg0 to VgR generated by the reference voltage generating part 90 on the basis of a video digital data signal supplied from the level shifter 60. Then, the decoder 50 distributes and supplies the selected two voltages (VA and VB) to the input terminals t<1> to t<$2^K$> of the differential amplifier 10. In addition, for example, a predetermined lower bit group of the video digital data signal is supplied to the differential amplifier 10, and tail current ratios of predetermined differential pairs of the differential amplifier 10 are controlled to be switched to three values or more. In accordance with this, for each combination of the selected two voltages (VA and VB), the differential amplifier 10 amplifies and outputs $2^N$ voltage levels dividing between the voltages VA and VB.

At this time, since the area of the digital-to-analog converter 150 illustrated in FIG. 13 is reduced, area reduction of the data driver 18 illustrated in FIG. 15 including these digital-to-analog converters corresponding to the number of output channels (n) is achieved.

Embodiment 5/Example 2

Figure 16:
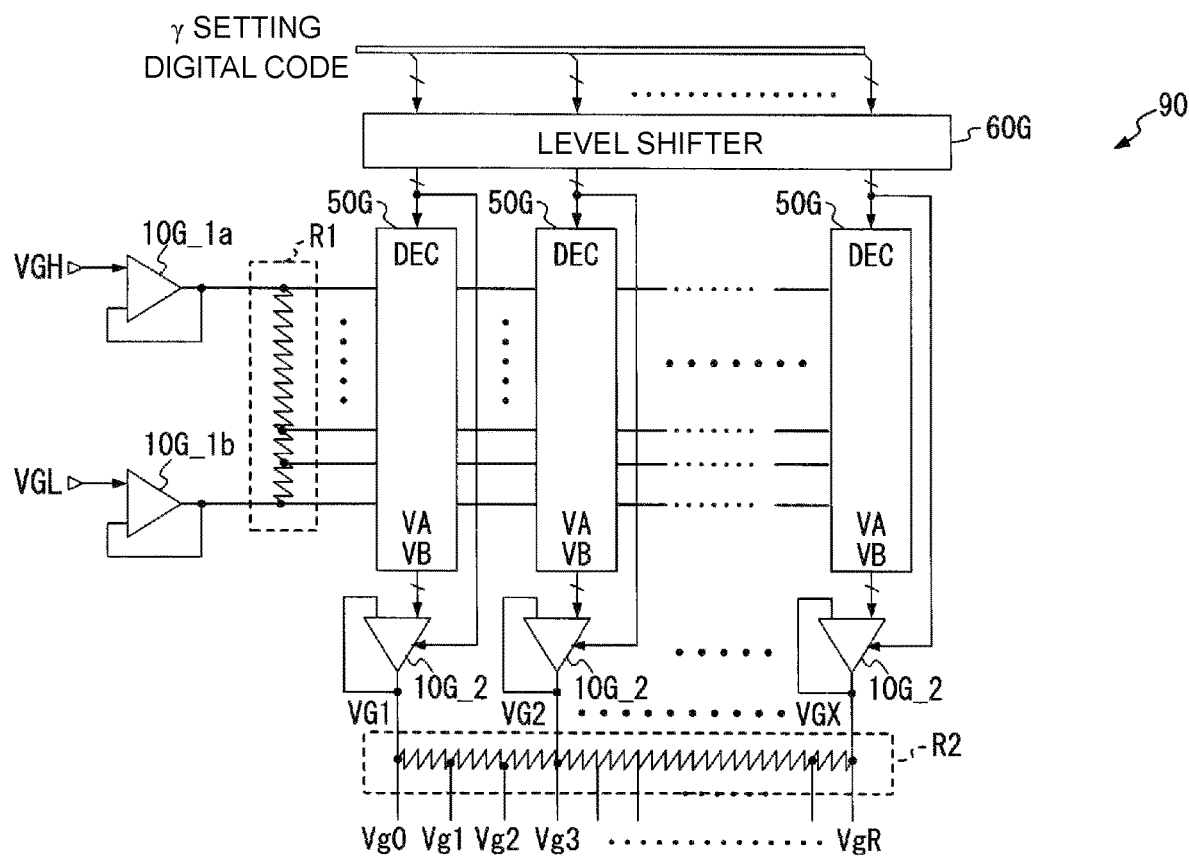
FIG. 16 is a circuit diagram illustrating an example of an internal configuration of a reference voltage generating part 90.

FIG. 16 is a circuit diagram illustrating an example of an internal configuration of the reference voltage generating part 90 illustrated in FIG. 15.

The reference voltage generating part 90 generates gamma power supply voltages having voltage values according to gamma characteristics appropriate for display characteristics of the display panel 15 in accordance with a gamma setting digital code and generates reference voltages Vg0 to VgR (here, R is an integer equal to or greater than 2) on the basis of the gamma power supply voltages.

As illustrated in FIG. 16, the reference voltage generating part 90 includes differential amplifiers 10G_1a and 10G_1b, ladder resistors R1 and R2, x (here, x is an integer equal to or greater than 3) decoders 50G, x gamma amplifiers 10G-2, and a level shifter 60G.

The differential amplifier 10G_1a applies a voltage acquired by performing current amplification of the reference power supply voltage VGH having a gamma reference voltage supplied from the outside to one end of the ladder resistor R1.

The differential amplifier 10G_1b applies a voltage acquired by performing current amplification of the reference power supply voltage VGL representing a gamma reference voltage, which is lower than the reference power supply voltage VGH, supplied from the outside to the other end of the ladder resistor R1.

The ladder resistor R1 generates linear divided voltages by dividing between voltages applied to one end and the other end thereof and supplies the generated linear divided voltages to the x decoders 50G.

The level shifter 60G, for example, receives a gamma setting digital code of 10 to 12 bits and supplies gamma setting digital code pieces of 10 to 12 bits acquired by performing level shift processing for increasing a signal amplitude of a signal level of each bit to the x decoders 50G.

Each decoder 50G selects two linear divided voltages adjacent to each other as two voltages (VA and VB) on the basis of gamma setting digital data pieces among linear divided voltages generated by the ladder resistor R1 and distributes the selected voltage VA or VB as an input voltage to differential pairs of the gamma amplifier 10G-2.

Each gamma amplifier 10G-2, for example, is formed from the differential amplifier 10 or 10A illustrated in FIG. 1 or FIG. 3 and outputs each voltage level acquired by dividing between the voltages VA and VB on the basis of input voltages V<1> to V<$2^K$> to which the voltage VA or VB is distributed as a gamma power supply voltage. x gamma power supply voltages output from a predetermined number (x) of gamma amplifiers 10G-2 are supplied to both-end taps and a middle tap of the ladder resistor R2 as gamma power supply voltages VG1 to VGX. In accordance with this, the ladder resistor R2 generates reference voltages Vg0 to VgR (here, R is an integer equal to or greater than 2) corresponding to gamma characteristics.

Here, as the decoder 50G and the gamma amplifier 10G_2 illustrated in FIG. 16, the digital-to-analog converter 150 illustrated in FIG. 13 can be applied. In a case in which high-accuracy gamma characteristics are handled, the gamma setting digital code becomes 10 to 12 bits, and thus, conventionally, the number of wirings drawing divided voltages from the ladder resistor R1, the number of elements configuring the decoder 50G, and the number of differential pairs of the gamma amplifier 10G_2 become large, and there is a problem in that the area of the reference voltage generating part 90 is increased. By employing the configuration of the digital-to-analog converter 150 illustrated in FIG. 13 as the decoder 50G and the gamma amplifier 10G_2, area reduction of the decoder 50G and the gamma amplifier 10G_2 can be realized.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A digital-to-analog conversion circuit that converts digital data of N bits into an analog output voltage and outputs the output voltage, N being a positive number equal to or greater than 3, the digital-to-analog conversion circuit comprising:

a differential amplifier having a plurality of input terminals and outputting the output voltage from an output terminal in accordance with a calculation result based on voltages received at the plurality of input terminals; and a first decoder receiving first and second voltages and distributing and supplying one of the first and second voltages to each of the plurality of input terminals of the differential amplifier on the basis of the digital data of the N bits, wherein the differential amplifier includes:

$2^K$ differential pairs each including an inverting input terminal to which the output voltage is commonly input and a non-inverting input terminal to which one of voltages received by the plurality of input terminals is input, the differential pairs being driven by tail currents respectively and having output pairs commonly connected with each other, K being a positive number satisfying N>K;

an amplification stage generating the output voltage in accordance with an amplification operation based on an output signal of one or both of the output pairs of the $2^K$ differential pairs that are commonly connected; and a tail current control circuit supplying the tail currents respectively to the $2^K$ differential pairs on the basis of a predetermined bit of the digital data of the N bits and individually controlling current ratios of the tail currents with respect to a reference current value for the respective differential pairs, and the differential amplifier outputs one of voltage levels dividing the first voltage and the second voltage into $2^N$ parts as the output voltage in accordance with the digital data of the N bits.

2. The digital-to-analog conversion circuit according to claim 1, wherein each of the $2^K$ differential pairs is composed of a transistor pair having equivalent characteristics in the same conductivity type, and the differential pairs are formed using transistor pairs having equivalent characteristics in the same conductivity type.

3. The digital-to-analog conversion circuit according to claim 1, wherein the tail current control circuit performs control of the current ratios such that a total or an average of the current ratios of the tail currents respectively supplied to the $2^K$ differential pairs becomes approximately constant.

4. The digital-to-analog conversion circuit according to claim 3, wherein the tail current control circuit performs variable control of the current ratios of the tail currents supplied to at least predetermined two differential pairs among the $2^K$ differential pairs in accordance with the predetermined bit.

5. The digital-to-analog conversion circuit according to claim 4, wherein, in a case in which the output voltage having a voltage value except for the same voltage value as the first voltage or the second voltage is output, the first decoder selectively outputs at least one of the first voltage and the second voltage to one of the predetermined two differential pairs and selectively outputs the other of the first voltage and the second voltage to the other of the predetermined two differential pairs.

6. The digital-to-analog conversion circuit according to claim 4, wherein the tail current control circuit exchanges control of the current ratios of the tail currents for the predetermined two differential pairs with other differential pairs having the same input voltage in accordance with the digital data.

7. The digital-to-analog conversion circuit according to claim 4, wherein the tail current control circuit performs control of the current ratios of the tail currents respectively supplied to the differential pairs except for the predetermined two differential pairs among the $2^K$ differential pairs to be a constant value regardless of the digital data.

8. The digital-to-analog conversion circuit according to claim 4, wherein the tail current control circuit performs control of a plurality of differential pairs in which voltages input to the non-inverting input terminals thereof are the same among the $2^K$ differential pairs to have a plurality of current ratios of which totals or averages of the current ratios of the tail currents supplied to the plurality of differential pairs are the same.

9. The digital-to-analog conversion circuit according to claim 1, wherein the tail current control circuit performs control of the current ratios of the tail currents respectively supplied to the $2^K$ differential pairs using three values, four values, or seven values.

10. The digital-to-analog conversion circuit according to claim 4, wherein, in a configuration in which the differential amplifier outputs voltage levels dividing the first voltage and the second voltage into $2^N$ parts as the output voltages in accordance with the digital data of the N bits, K represented in the $2^K$ differential pairs is set to (N−1), for 1st to w-th voltage levels except for the same voltage value as the first voltage and the second voltage among the output voltages, the tail current control circuit performs variable control of the current ratios of the tail currents supplied to at least predetermined two differential pairs to three values in accordance with the voltage levels, and in a control method thereof, when an odd-numbered voltage level from the first voltage or the second voltage is output among the 1st to w-th voltage levels, the current ratios of the tail currents respectively supplied to the predetermined two differential pairs are respectively controlled to be 0.5 and 1.5, and when an even-numbered voltage level from the first voltage or the second voltage is output among the 1st to w-th voltage levels, the current ratios of the tail currents respectively supplied to the predetermined two differential pairs are controlled to 1.

11. The digital-to-analog conversion circuit according to claim 4, wherein, in a configuration in which the differential amplifier outputs voltage levels dividing the first voltage and the second voltage into $2^N$ parts as the output voltages in accordance with the digital data of the N bits, K represented in the $2^K$ differential pairs is set to (N−2), for 1st to w-th voltage levels except for the same voltage value as the first voltage and the second voltage among the output voltages, the tail current control circuit performs variable control of the current ratios of the tail currents supplied to at least predetermined two differential pairs to seven values in accordance with the voltage levels, and in a control method thereof, when a first voltage level adjacent to the first voltage or the second voltage is output among the 1st to w-th voltage levels, the current ratios of the tail currents respectively supplied to the predetermined two differential pairs are controlled to be 0.25 and 1.75, when a second voltage level second adjacent to the first voltage or the second voltage is output among the 1st to w-th voltage levels, the current ratios of the tail currents respectively supplied to the predetermined two differential pairs are controlled to be 0.5 and 1.5, when a third voltage level third adjacent to the first voltage or the second voltage is output among the 1st to w-th voltage levels, the current ratios of the tail currents respectively supplied to the predetermined two differential pairs are controlled to be 0.75 and 1.25, and when a fourth voltage level fourth adjacent to the first voltage or the second voltage is output among the 1st to w-th voltage levels, both the current ratios of the tail currents respectively supplied to the predetermined two differential pairs are controlled to be 1.

12. The digital-to-analog conversion circuit according to claim 3, wherein, in a configuration in which the differential amplifier outputs voltage levels dividing the first voltage and the second voltage into $2^N$ parts as the output voltages in accordance with the digital data of the N bits, K represented in the $2^K$ differential pairs is set to (N−2), for each of the output voltages, the tail current control circuit performs variable control of the current ratios of the tail currents respectively supplied to the $2^K$ differential pairs to a combination of four values including 0.25, 0.75, 1.25, and 1.75 of which an average value becomes 1 in accordance with the voltage levels.

13. The digital-to-analog conversion circuit according to claim 1,
wherein the tail current control circuit includes:
a plurality of constant current sources for which the current ratios are fixed; and
a switching circuit changing a combination of currents to be synthesized from the plurality of constant current sources on the basis of the predetermined bit of the digital data of the N bits, and
wherein currents are supplied through the switching circuit to the differential pairs of which the current ratios become variable among the tail currents respectively supplied to the $2^K$ differential pairs.

14. The digital-to-analog conversion circuit according to claim 1, further comprising:
a reference voltage generating part generating a plurality of reference voltages having voltage values different from each other; and
a second decoder receiving digital data of M bits including the digital data of the N bits and the plurality of reference voltages, selecting two reference voltages adjacent to each other from among the plurality of reference voltages on the basis of (M−N) bits of the digital data of the M bits, and supplying the selected two reference voltages respectively to the first decoder as the first voltage and the second voltage, M being an integer satisfying M>N.

15. The digital-to-analog conversion circuit according to claim 14,
wherein the reference voltage generating part includes:
a first ladder resistor, in which a predetermined power supply voltage is given to both ends, generating a plurality of voltages through resistance division;
a third decoder receiving the plurality of voltages, selecting two voltages adjacent to each other from among the plurality of voltages on the basis of a gamma setting digital code, and distributing one or the other of the two voltages as a plurality of input voltages;
a plurality of gamma amplifiers each having a plurality of input terminals and outputting a weighted average voltage of the input voltages received at the plurality of input terminals as a gamma power supply voltage; and
a second ladder resistor receiving the gamma power supply voltages respectively output from the plurality of gamma amplifiers at a plurality of taps and generating the plurality of reference voltages through resistance division between the plurality of taps, and
wherein the gamma amplifier includes power of 2 differential pairs each including an inverting input terminal to which the gamma power supply voltage is commonly input and a non-inverting input terminal to which one of the plurality of input voltage is input, the differential pairs being driven with tail currents respectively and having output pairs commonly connected with each other; and
a second tail current control circuit supplying the tail currents respectively to the power of 2 differential pairs and individually controlling the current ratios of the tail currents with respect to a reference current value for respective differential pairs on the basis of a predetermined bit of the gamma setting digital code,
wherein one of voltage levels dividing the two voltages into power of 2 parts is output as the gamma power supply voltage in accordance with the gamma setting digital code.

16. A data driver comprising a plurality of the digital-to-analog conversion circuits according to claim 1, the data driver converting video digital data pieces representing luminance levels of pixels using digital values into a plurality of output voltages respectively having analog voltage values using the plurality of the digital-to-analog conversion circuits, and supplying a plurality of drive signals respectively having the plurality of output voltages to a plurality of data lines of a display panel, respectively.

17. A display device comprising:
a display panel having a plurality of data lines to which a plurality of display cells are connected respectively; and
a data driver including a plurality of the digital-to-analog conversion circuits according to claim 1, converting video digital data pieces representing luminance levels of pixels using digital values into a plurality of output voltages respectively having analog voltage values using the plurality of the digital-to-analog conversion circuits, and supplying a plurality of drive signals respectively having the plurality of output voltages to the plurality of data lines of the display panel, respectively.

* * * * *